United States Patent
Jeong et al.

(10) Patent No.: US 12,389,752 B2
(45) Date of Patent: Aug. 12, 2025

(54) DISPLAY PANEL

(71) Applicant: LG DISPLAY CO., LTD., Seoul (KR)

(72) Inventors: Seong Hun Jeong, Paju-si (KR); Seung Seok Ryoo, Paju-si (KR)

(73) Assignee: LG Display Co., Ltd., Seoul (KR)

(*) Notice: Subject to any disclaimer, the term of this patent is extended or adjusted under 35 U.S.C. 154(b) by 505 days.

(21) Appl. No.: 17/846,460

(22) Filed: Jun. 22, 2022

(65) Prior Publication Data

US 2023/0048688 A1 Feb. 16, 2023

(30) Foreign Application Priority Data

Aug. 11, 2021 (KR) .................. 10-2021-0105806

(51) Int. Cl.
*H10K 50/80* (2023.01)
*H10K 50/84* (2023.01)
*H10K 59/121* (2023.01)
*H10K 59/122* (2023.01)
*H10K 59/38* (2023.01)
*H10K 59/40* (2023.01)

(52) U.S. Cl.
CPC .......... *H10K 59/122* (2023.02); *H10K 50/84* (2023.02); *H10K 50/868* (2023.02); *H10K 59/121* (2023.02); *H10K 59/38* (2023.02); *H10K 59/40* (2023.02)

(58) Field of Classification Search
CPC .... H10K 59/122; H10K 50/84; H10K 50/868; H10K 59/121; H10K 59/38; H10K 59/40; H10K 50/865; H10K 59/173; H10K 50/844; H10K 50/86; G09G 3/32
See application file for complete search history.

(56) References Cited

U.S. PATENT DOCUMENTS

| | | |
|---|---|---|
| 2006/0097263 A1 | 5/2006 | Lee et al. |
| 2011/0108859 A1 | 5/2011 | Oosako |
| 2012/0091483 A1 | 4/2012 | Matsushima |
| 2017/0033166 A1* | 2/2017 | Shim ................ H10K 59/1315 |
| 2017/0133442 A1 | 5/2017 | Hosono et al. |
| 2018/0061904 A1 | 3/2018 | Shim et al. |
| 2020/0350387 A1 | 11/2020 | Kim et al. |

(Continued)

FOREIGN PATENT DOCUMENTS

| | | |
|---|---|---|
| CN | 113013203 A | 6/2021 |
| EP | 2451251 A1 | 5/2012 |
| KR | 10-0990262 B1 | 10/2010 |

(Continued)

OTHER PUBLICATIONS

Examination Report issued Jul. 20, 2023, issued for the corresponding UK patent application GB2209264.7.

(Continued)

*Primary Examiner* — Elias Ullah
(74) *Attorney, Agent, or Firm* — Morgan, Lewis & Bockius LLP

(57) ABSTRACT

A display panel may include a bank pattern having an opening through which an electrode pattern of a light-emitting element layer is exposed. The bank pattern may include a tapered part having a width from an end of an electrode pattern to the opening. At least one of a width and a slope angle of the tapered part may be partially differently set.

14 Claims, 27 Drawing Sheets

(56) References Cited

U.S. PATENT DOCUMENTS

2020/0373366 A1  11/2020  Sim et al.

FOREIGN PATENT DOCUMENTS

| KR | 10-2016-0054720 A | 5/2016 |
| KR | 10-1970539 B1 | 8/2019 |
| KR | 10-2248402 B1 | 5/2021 |

OTHER PUBLICATIONS

Combined Search and Examination Report dated Jan. 11, 2023 issued in British Patent Application No. 2209264.7.
Office Action dated Apr. 14, 2025, issued for the corresponding German Patent Application No. 102022119863.4. (Note: EP 2451251 B1 and US 2020/0373366 A1 already submitted.).

* cited by examiner

⟶ CONSTRUCTIVE INTERFERENCE (BRIGHT)
--→ DESTRUCTIVE INTERFERENCE (DARK)

DISPLAY PANEL

CROSS-REFERENCE TO RELATED APPLICATION

This application claims the benefit of and priority to Korean Patent Application No. 10-2021-0105806, filed on Aug. 11, 2021, the entirety of which is incorporated herein by reference for all purposes.

BACKGROUND

1. Field

The present disclosure relates to a display panel.

2. Discussion of Related Art

Electroluminescent display devices are typically classified as inorganic light emitting display devices or organic light emitting display devices depending on the material of the emission layer. An organic light emitting display device of an active matrix type includes an organic light emitting diode (hereinafter, referred to as "OLED") that emits light by itself, and has an advantage in that the response speed is fast, the luminous efficiency and luminance are high, and the viewing angle is wide. In the organic light emitting display device, the OLED is formed in each pixel. The organic light emitting display device not only has a fast response speed and excellent luminous efficiency, luminance, and viewing angle, but also has an excellent contrast ratio and color reproducibility since it can express grayscale black in complete black.

Interference fringes can be seen in a display device due to a pixel structure and regularity of interconnections. Such interference fringes cause degradation of display quality of an image displayed on a display panel.

The description provided in the background section should not be assumed to be prior art merely because it is mentioned in or associated with the background section. The background section may include information that describes one or more aspects of the subject technology.

SUMMARY

In one or more aspects, embodiments of the present disclosure can solve the above-described needs and/or problems and other disadvantages of the related art.

In one or more aspects, embodiments of the present disclosure are directed to providing a display panel in which interference fringes are reduced.

The problems solved by embodiments of the present disclosure are not limited to those mentioned above, and other problems (not mentioned but solved by embodiments of the present disclosure) will be clearly understood by those skilled in the art from the description herein.

According to an aspect of the present disclosure, a display panel may include a circuit layer disposed on a substrate, a light-emitting element layer disposed on the circuit layer, and an encapsulation layer configured to cover the light-emitting element layer.

The light-emitting element layer may include a bank pattern having an opening covering an edge of an electrode pattern. The bank pattern may include a tapered part having a width from an end of the electrode pattern to the opening.

The bank pattern may include a tapered part formed at a boundary between an emission region and a non-emission region.

At least one of the width and a slope angle of the tapered part within a subpixel may be partially differently set. The width and the slope angle of the tapered part may vary within a subpixel of the display panel.

Additional features and aspects are set forth in part in the description that follows and in part will become apparent from the description or may be learned by practice of the inventive concepts provided herein. Other features and aspects of the inventive concepts may be realized and attained by the structures pointed out in the present disclosure, or derivable therefrom, and the claims hereof as well as the appended drawings.

It is to be understood that both the foregoing description and the following description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects and embodiments of the disclosure and together with the description serve to explain the principle of the disclosure. In the drawings.

Figure 1:
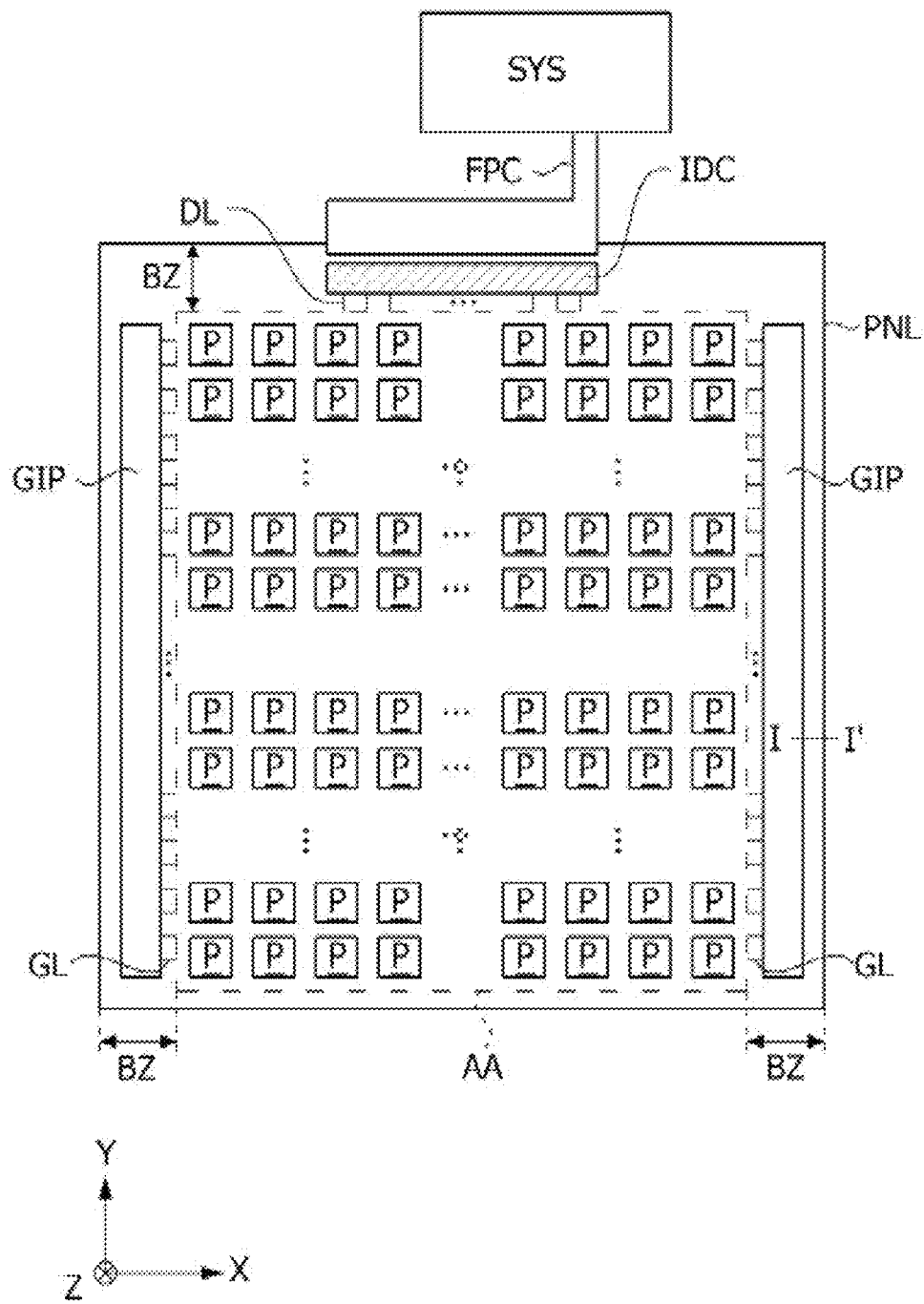
FIG. 1 is a view illustrating a display device according to an example embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION OF EXEMPLARY EMBODIMENTS

The advantages and features of the present disclosure and methods for accomplishing the same will be more clearly understood from embodiments described below with reference to the accompanying drawings. However, the present disclosure is not limited to the following embodiments but may be implemented in various different forms. Rather, the present embodiments will make the disclosure of the present disclosure complete and allow those skilled in the art to completely comprehend the scope of the present disclosure. The present disclosure is only defined within the scope of the accompanying claims and their equivalents.

The shapes, sizes, areas, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in describing the present disclosure, detailed descriptions of known related technologies may be omitted to avoid unnecessarily obscuring the subject matter of the present disclosure.

The terms such as "comprising," "including," "having," "containing," "constituting," "formed of," and the like are generally intended to allow one or more other components to be added unless the terms are used with a limiting term, such as "only." Any references to a singular form may include plural forms unless expressly stated otherwise. The word "exemplary" is used to mean serving as an example or illustration. Any implementation described herein as an "example" is not necessarily to be construed as preferred or advantageous over other implementations.

Components are interpreted to include an error or tolerance range even if not expressly stated.

When the positional relation between two components is described using the terms such as "on," "over," "under," "above," "below," "beneath," "near," "close to," or "adjacent to," "beside," "next to," or the like, one or more components may be disposed or located between the two components unless the terms are used with a limiting term, such as "immediately" or "directly." For example, when a structure is described as being positioned "on," "over," "under," "above," "below," "beneath," "near," "close to," or "adjacent to," "beside," or "next to" another structure, this description should be construed as including a case in which the structures contact each other as well as a case in which one or more additional structures are disposed or interposed therebetween. Furthermore, the terms "left," "right," "top," "bottom, "downward," "upward," "upper," "lower," and the like refer to an arbitrary frame of reference.

In describing a temporal relationship, when the temporal order is described as, for example, "after," "subsequent," "next," or "before," a case that is not continuous may be included unless a limiting term, such as "just," "immediate (ly)," or "direct(ly)" is used.

The terms "first," "second," and the like may be used to distinguish components from each other, but the functions or structures of the components are not limited by ordinal numbers or component names in front of the components.

In describing elements of the present disclosure, the terms "first," "second," "A," "B," "(a)," "(b)," or the like may be used. These terms are intended to identify the corresponding elements from the other elements, and basis, order, or number of the corresponding elements should not be limited by these terms.

For the expression that an element or layer is "connected," "coupled," or "adhered" to another element or layer, the element or layer can not only be directly connected, coupled, or adhered to another element or layer, but also be indirectly connected, coupled, or adhered to another element or layer with one or more intervening elements or layers disposed or interposed between the elements or layers, unless otherwise specified.

For the expression that an element or layer "contacts," "overlaps," or the like with another element or layer, the element or layer can not only directly contact, overlap, or the like with another element or layer, but also indirectly contact, overlap, or the like with another element or layer with one or more intervening elements or layers disposed or interposed between the elements or layers, unless otherwise specified.

The term "at least one" should be understood as including any and all combinations of one or more of the associated listed items. For example, the meaning of "at least one of a first item, a second item, and a third item" denotes the combination of items proposed from two or more of the first item, the second item, and the third item as well as only one of the first item, the second item, or the third item.

The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C.

Features of various embodiments of the present disclosure may be partially or wholly coupled to or combined with each other and may be variously inter-operated, linked or driven together. The embodiments of the present disclosure may be carried out independently from each other or may be carried out together in a co-dependent or related relationship. The components of each apparatus according to various embodiments of the present disclosure are operatively coupled and configured.

In a display device of one or more example embodiments of the present disclosure, a pixel circuit and a gate driving circuit may include a plurality of transistors. Transistors may be implemented as oxide thin film transistors (oxide TFTs) including an oxide semiconductor, low temperature poly-silicon (LTPS) TFTs including low temperature polysilicon, or the like. Each of the transistors may be implemented as a p-channel TFT or an n-channel TFT.

Generally, a transistor may be a three-electrode element including a gate, a source, and a drain. The source may be or may include an electrode that supplies carriers to the transistor. In the transistor, carriers may start to flow from the source. The drain may be or may include an electrode through which carriers exit from the transistor. In a transistor, carriers may flow from a source to a drain. In the case of an n-channel transistor, since carriers are electrons, a source voltage is a voltage lower than a drain voltage such that electrons may flow from a source to a drain. The n-channel transistor has a direction of a current flowing from the drain to the source. In the case of a p-channel transistor, since carriers are holes, a source voltage is higher than a drain voltage such that holes may flow from a source to a drain. In the p-channel transistor, since holes flow from the source to the drain, a current flows from the source to the drain. It should be noted that a source and a drain of a transistor are not fixed. For example, a source and a drain may be changed according to an applied voltage. Therefore, the disclosure is not limited due to a source and a drain of a transistor. In the following description, a source and a drain of a transistor may be referred to as a first electrode and a second electrode.

A gate signal may swing between a gate-on voltage and a gate-off voltage. The gate-on voltage may be set to a voltage higher than a threshold voltage of a transistor, and the gate-off voltage may be set to a voltage lower than the threshold voltage of the transistor.

The transistor may be turned on in response to the gate-on voltage and may be turned off in response to the gate-off voltage. In the case of an n-channel transistor, a gate-on voltage may be a gate high voltage VGH and VEH, and a gate-off voltage may be a gate low voltage VGL and VEL. In the case of a p-channel transistor, the gate-on voltage may be a gate-low voltage VGL and VEL, and the gate-off voltage may be a gate high voltage VGH and VEH.

Hereinafter, various embodiments of the present disclosure may be described in detail with reference to the accompanying drawings. In addition, for convenience of description, a scale, size and thickness of each of the elements illustrated in the accompanying drawings may differ from an actual scale, size and thickness, and thus, embodiments of the present disclosure are not limited to a scale, size and thickness illustrated in the drawings.

Referring to FIG. 1, a display device of an example embodiment of the present disclosure includes a display panel PNL in which a pixel array AA is disposed on a screen, and a display panel driver.

The pixel array AA of the display panel PNL includes data lines DL, gate lines GL crossing the data lines DL, and a plurality of pixels P. The pixels P may be arranged in the form of a matrix defined by the data lines DL and the gate lines GL.

Each of the pixels P includes subpixels having different colors for color realization. The subpixels include red subpixels (hereinafter, referred to as "R subpixels"), green subpixels (hereinafter, referred to as "G subpixels"), and blue subpixels (hereinafter, referred to as "B subpixels"). Each of the pixels P may further include a white subpixel.

Hereinafter, a pixel may be interpreted as a subpixel unless otherwise defined. Each of the subpixels may include a pixel circuit.

The pixel circuit may include a light-emitting element, a driving element that supplies a current to the light-emitting element, one or more switching elements that switch current paths of the driving element and light-emitting element, a capacitor that maintains a gate-source voltage Vgs of the driving element, and the like.

The light-emitting element may be implemented as an organic light-emitting diode (OLED). The OLED may include an organic compound layer formed between an anode and a cathode. The organic compound layer may include a hole injection layer (HIL), a hole transport layer (HTL), an emission layer (EML), an electron transport layer (ETL), and an electron injection layer (EIL), but the present disclosure is not limited thereto. When voltages are applied to the anode and the cathode of the OLED, holes passing through the HTL and electrons passing through the ETL are moved to the EML to form excitons, and visible light is emitted from the EML.

The display panel driver writes pixel data of an input image in the pixels P. The display panel driver includes a data driver that supplies a data voltage of the pixel data to the data lines DL and a gate driver GIP that sequentially supplies a gate pulse to the gate lines GL. The data driver may be integrated into a drive integrated circuit (IC) DIC. The drive IC DIC may be adhered onto a bezel region BZ at an upper end or a lower end of the display panel PNL. The bezel region BZ is a non-display region outside the pixel array AA.

The data driver of the drive IC DIC converts the pixel data into a gamma compensation voltage through a digital-to-analog converter (DAC) and outputs the data voltage. The drive IC DIC is connected to the data lines DL through data output channels to supply the data voltage to the data lines DL.

The drive IC DIC may include a timing controller. The timing controller transmits pixel data of an input image received from a host system SYS to the data driver and controls operation timings of the data driver and the gate driver GIP.

The gate driver GIP may include a shift register which is formed with the pixel array AA on a circuit layer of the display panel PNL. The shift register of the gate driver GIP supplies gate signals sequentially to the gate lines GL under the control of the timing controller. The gate signal may include a scan pulse and an emission control pulse (hereinafter, referred to as an "EM pulse"). The shift register may include a scan driver that outputs the scan pulse, and an EM driver that outputs the EM pulse. The gate driver GIP may be disposed in the left and right bezel regions BZ of the display panel PNL.

The host system SYS may be implemented as an application processor (AP). The host system SYS transmits the pixel data of the input image to the drive IC DIC. The host system SYS may be connected to the drive IC DIC through a flexible printed circuit (FPC).

The display panel PNL has a width in an X-axis direction, a length in a Y-axis direction, and a constant thickness in a Z-axis direction. The display panel PNL may be manufactured to have a rectangular plate shape, but the present disclosure is not limited thereto.

Due to process variation and element characteristic variation caused in the manufacturing process of the display panel, there may be a difference in electrical characteristics of a driving element between subpixels, and the difference may be further increased as a driving time of the pixels elapses. In order to compensate for variation of the electrical characteristic of the driving element between the pixels, an internal compensation technique or an external compensation technique may be applied to an organic light-emitting display device.

In the internal compensation technique, an internal compensation circuit implemented in each pixel circuit is used to detect a threshold voltage of a driving element for each subpixel, and a gate-source voltage Vgs of the driving element is compensated with the threshold voltage. In the external compensation technique, an external compensation circuit is used to detect a current or voltage of a driving element in real time, which varies according to electrical characteristics of the driving element. In the external compensation technique, by modulating pixel data (digital data) of an input image by the variation (or change) of the electrical characteristic of the driving element detected for each pixel, the variation (or change) of the electrical characteristic of the driving element is compensated for in real time in each pixel.

Figure 2:
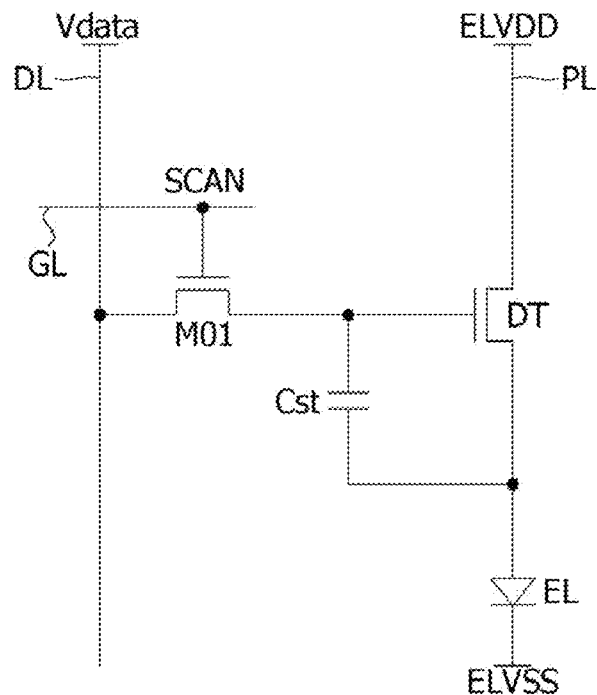
FIGS. 2 to 4 are circuit diagrams illustrating various pixel circuits applicable as pixel circuits of example embodiments of the present disclosure.
Figure 3:
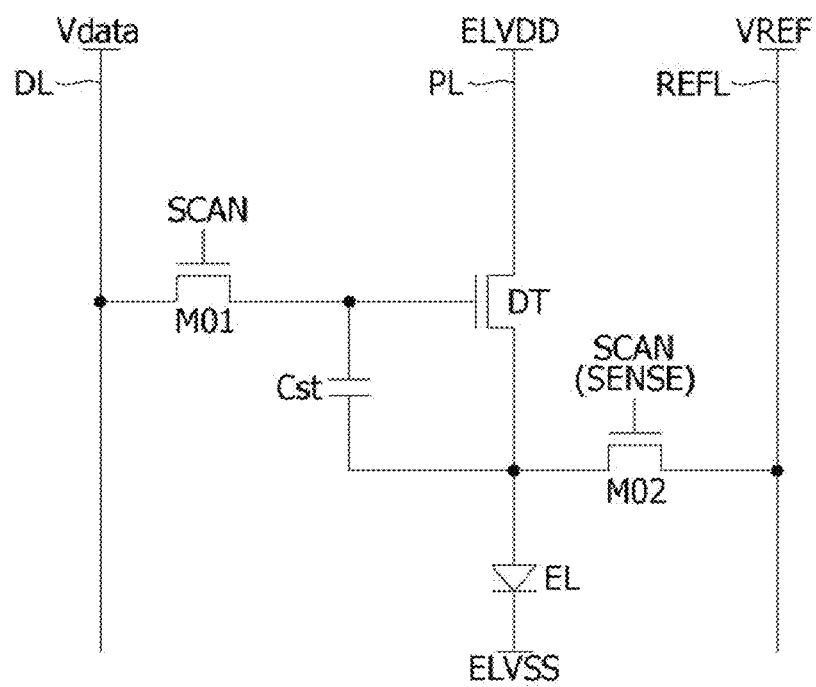
Figure 4:
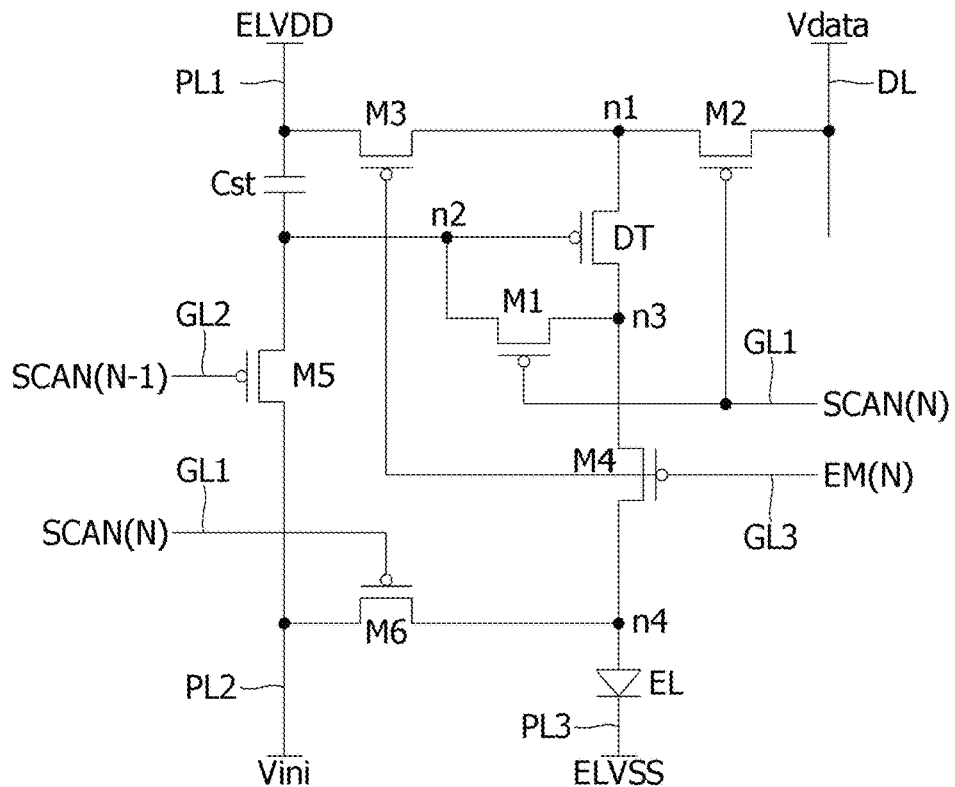

FIGS. 2 to 4 are circuit diagrams illustrating various pixel circuits applicable as the pixel circuits of example embodiments of the present disclosure. It should be noted that the pixel circuits of the present disclosure are not limited to those illustrated in FIGS. 2 to 4.

Referring to FIG. 2, a pixel circuit may include a light-emitting element EL, a driving element DT that supplies a current to the light-emitting element EL, a switching element M01 that connects a data line DL in response to a scan pulse SCAN, and a capacitor Cst connected to a gate electrode of the driving element DT. In the pixel circuit, the driving element DT and the switching element M01 may be implemented as n-channel transistors.

The switching element M01 may be turned on according to a gate-on voltage of the scan pulse SCAN to connect the data line DL to the gate electrode of the driving element DT.

The driving element DT may include a first electrode connected to a VDD line PL to which a pixel driving voltage ELVDD is applied, a gate electrode connected to the switching element M01 and the capacitor Cst, and a second electrode connected to the light-emitting element EL. The driving element DT may supply a current to the light-emitting element EL according to a gate-source voltage Vgs to drive the light-emitting element EL. When a forward voltage between an anode and a cathode is greater than or equal to a threshold voltage, the light-emitting element EL is turned on and emits light.

The capacitor Cst may be disposed between and connected to the gate electrode and a second electrode of the driving element DT and store the gate-source voltage Vgs of the driving element DT.

Referring to FIG. 3, the pixel circuit may further include a second switching element M02 disposed between and connected to a reference voltage line REFL and the second electrode of the driving element DT. In the pixel circuit, the driving element DT and the switching elements M01 and M02 may be implemented as n-channel transistors.

The second switching element M02 may be turned on according to the gate-on voltage of the scan pulse SCAN or a sensing pulse SENSE to connect the reference voltage line REFL, to which a reference voltage Vref is applied, to the second electrode of the driving element DT.

In a sensing mode, a current flowing through a channel of the driving element DT or a voltage between the driving element DT and the light-emitting element EL may be detected through the reference line REFL. The current flowing through the reference line REFL may be converted into a voltage through an integrator and be converted into digital data through an analog-to-digital converter (hereinafter, referred to as an "ADC"). The digital data may be sensing data including the threshold voltage of the driving element DT or mobility information. The sensing data may be transmitted to a compensation unit of the drive IC DIC. The compensation unit may receive the sensing data from the ADC and compensate for a deviation or change in the threshold voltage of the driving element DT by adding a compensation value selected based on the sensing data to pixel data or multiplying the compensation value and the pixel data.

The pixel circuit illustrated in FIGS. 2 and 3 may further include an EM switching element that switches a current path of the light-emitting element EL in response to the EM pulse. The EM switching element may be disposed between and connected to the pixel driving voltage ELVDD and the driving element DT or disposed between and connected to the driving element DT and the light-emitting element, such as a light-emitting diode (e.g., LED).

Figure 5:
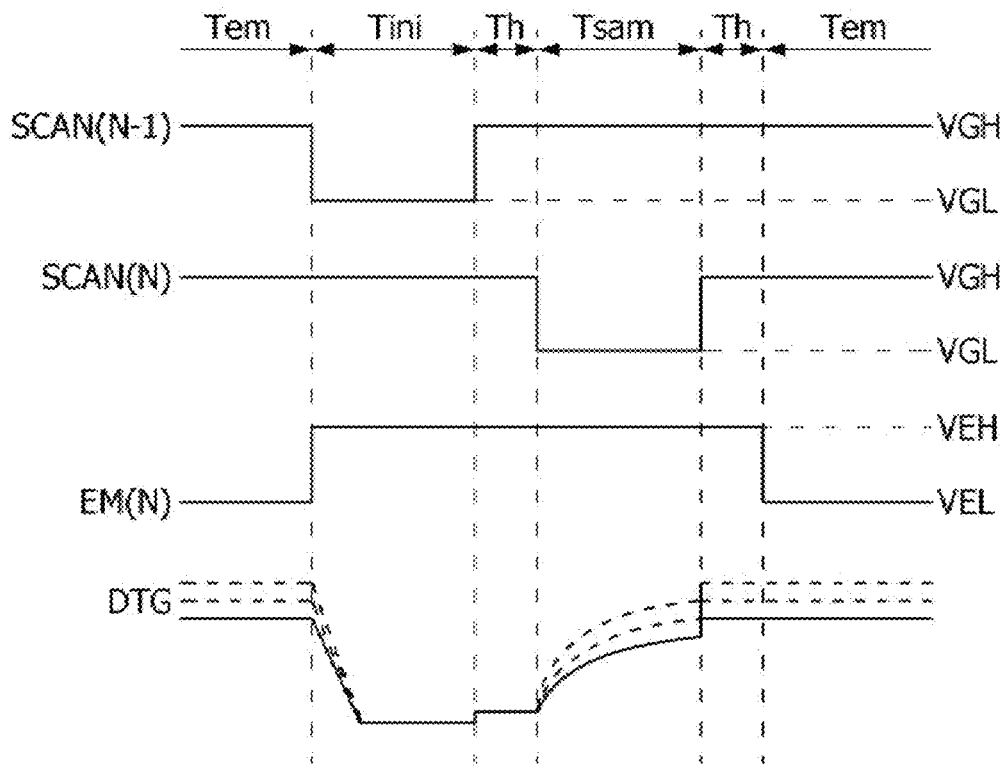
FIG. 5 is an example of a waveform diagram illustrating driving signals applied to the pixel circuit illustrated in FIG. 4.

FIG. 4 is a circuit diagram illustrating an example of a pixel circuit to which an internal compensation circuit is applied. FIG. 5 is an example of a waveform diagram illustrating driving signals applied to the pixel circuit illustrated in FIG. 4.

Referring to FIGS. 4 and 5, the pixel circuit may include a light-emitting element EL, a driving element DT that supplies a current to the light-emitting element EL, and switch circuits that switch voltages applied to the light-emitting element EL and the driving element DT.

The switch circuits may be connected to power lines PL1, PL2, and PL3, to which a pixel driving voltage ELVDD, a low potential power voltage ELVSS, and an initialization voltage Vini are applied, a data line DL, and gate lines GL1, GL2, and GL3. The switch circuits may switch voltages applied to the light-emitting element EL and the driving element DT in response to scan pulses SCAN(N−1) and SCAN(N) and an EM pulse EM(N).

The switch circuit may sample a threshold voltage Vth of the driving element DT using a plurality of switching elements M1 to M6 to store the sampled threshold voltage Vth of the driving element DT in a capacitor Cst, and compensate a gate voltage of the driving element DT with the threshold voltage Vth of the driving element DT. Each of the driving element DT and the switching elements M1 to M6 may be implemented as a p-channel transistor.

A driving period of the pixel circuit may be divided into an initialization period Tini, a sampling period Tsam, and an emission period Tem, as illustrated in FIG. 5.

An $N^{th}$ scan pulse SCAN(N) may be generated as a gate-on voltage VGL in the sampling period Tsam and applied to a first gate line GL1. An $(N-1)^{th}$ scan pulse SCAN(N−1) may be generated prior to the $N^{th}$ scan pulse SCAN(N) and applied to a second gate line GL2. The initialization period Tini is defined by the $(N-1)^{th}$ scan pulse SCAN(N−1). The EM pulse EM(N) may be generated as a gate-off voltage VEH in the initialization period Tini and the sampling period Tsam and applied to a third gate line GL3.

During the initialization period Tini, the $(N-1)^{th}$ scan pulse SCAN(N−1) may be generated as a gate-on voltage VGL and applied to the second gate line GL2. During the initialization period Tini, voltages of the first and third gate lines GL1 and GL3 may be gate-off voltages VGH and VEH.

During the sampling period Tsam, the $N^{th}$ scan pulse SCAN(N) may be generated as a pulse of the gate-on voltage VGL and applied to the first gate line GL1. During the sampling period Tsam, voltages of the second and third gate lines GL2 and GL3 may be gate-off voltages VGH.

During at least one section of the emission period Tem, the EM pulse EM(N) may be generated as a gate-on voltage VEL and applied to the third gate line GL3. During the emission period Tem, the voltages of the first and second gate lines GL1 and GL2 may be the gate-off voltage VGH.

An anode of the light-emitting element EL may be connected to a fourth node n4 disposed between fourth and sixth switching elements M4 and M6. The fourth node n4 may be connected to the anode of the light-emitting element EL, a second electrode of a fourth switching element M4, and a second electrode of a sixth switching element M6. A cathode of the light-emitting element EL may be connected to a VSS line PL3 to which the low potential power voltage ELVSS is applied. The light-emitting element EL may emit light with a current flowing according to a gate-source voltage Vgs of the driving element DT. A current path of the light-emitting element EL may be switched by the second and fourth switching elements M2 and M4.

The capacitor Cst may be disposed between and connected to a VDD line PL1 and a second node n2. The capacitor Cst may include a first electrode connected to the VDD line PL1, and a second electrode connected to the second node n2. Data voltage Vdata compensated with a threshold voltage Vth of the driving element DT may be charged in the capacitor Cst. Since data voltage Vdata is compensated with the threshold voltage Vth of the driving element DT in each subpixel, a variation (or change) of the characteristics of the driving element DT in the subpixels are compensated for.

A first switching element M1 may be turned on according to the gate-on voltage VGL of the $N^{th}$ scan pulse SCAN(N) and connect the second node n2 to a third node n3. The second node n2 may be connected to a gate electrode of the driving element DT, the second electrode of the capacitor Cst, and a first electrode of the first switching element M1. The third node n3 may be connected to a second electrode of the driving element DT, a second electrode of the first switching element M1, and a first electrode of the fourth switching element M4. A gate electrode of the first switching element M1 may be connected to the first gate line GL1 to receive the $N^{th}$ scan pulse SCAN(N). The first electrode of the first switching element M1 may be connected to the second node n2, and the second electrode of the first switching element M1 may be connected to the third node n3.

In one or more examples, since the first switching element M1 is turned on during one very short horizontal period 1H, in which the $N^{th}$ scan pulse SCAN(N) is generated as the gate-on voltage VGL in one frame period, a leakage current may be generated in an off state. In order to suppress the leakage current of the first switching element M1, the first switching element M1 may be implemented as a transistor having a dual gate structure in which two transistors are connected in series.

The second switching element M2 may be turned on according to the gate-on voltage VGL of the $N^{th}$ scan pulse SCAN(N) to supply the data voltage Vdata to the first node n1. A gate electrode of the second switching element M2 may be connected to the first gate line GL1 to receive the $N^{th}$ scan pulse SCAN(N). A first electrode of the second switching element M2 may be connected to the first node n1. A second electrode of the second switching element M2 may be connected to the data line DL to which the data voltage Vdata is applied. The first node n1 may be connected to the first electrode of the second switching element M2, a second electrode of a third switching element M3, and a first electrode of the driving element DT.

The third switching element M3 may be turned on according to the gate-on voltage VEL of the EM pulse EM(N) to connect the VDD line PL1 to the first node n1. A gate electrode of the third switching element M3 may be connected to the third gate line GL3 to receive the EM pulse EM(N). A first electrode of the third switching element M3 may be connected to the VDD line PL1. A second electrode of the third switching element M3 may be connected to the first node n1.

The fourth switching element M4 may be turned on according to the gate-on voltage VEL of the EM pulse EM(N) to connect the third node n3 to the fourth node n4. A gate electrode of the fourth switching element M4 may be connected to the third gate line GL3 to receive the EM pulse EM(N). The first electrode of the fourth switching element M4 may be connected to the third node n3, and a second electrode of the fourth switching element M4 may be connected to the fourth node n4.

A fifth switching element M5 may be turned on according to a gate-on voltage VGL of the $(N-1)^{th}$ scan pulse SCAN(N-1) to connect the second node n2 to a Vini line PL2. A gate electrode of the fifth switching element M5 may be connected to the second gate line GL2 to receive the $(N-1)^{th}$ scan pulse SCAN(N-1). A first electrode of the fifth switching element M5 may be connected to the second node n2, and a second electrode of the fifth switching element M5 may be connected to the Vini line PL2 to which the initialization voltage Vini is applied. In order to suppress a leakage current of the fifth switching element M5, the fifth switching element M5 may be implemented as a transistor having a dual gate structure in which two transistors are connected in series.

The sixth switching element M6 may be turned on according to the gate-on voltage VGL of the $N^{th}$ scan pulse SCAN(N) to connect the Vini line PL2 to the fourth node n4. A gate electrode of the sixth switching element M6 may be connected to the first gate line GL1 to receive the $N^{th}$ scan pulse SCAN(N). A first electrode of the sixth switching element M6 may be connected to the Vini line PL2, and the second electrode may be connected to the fourth node n4. In another embodiment, the gate electrodes of the fifth and sixth switching elements M5 and M6 may be commonly connected to the second gate line GL2 to which the $(N-1)^{th}$ scan pulse SCAN(N-1) is applied. In this case, the fifth and sixth switching elements M5 and M6 may be simultaneously turned on in response to the $(N-1)^{th}$ scan pulse SCAN(N-1) in the initialization period Tini.

The driving element DT may adjust a current flowing through the light-emitting element EL according to the gate-source voltage Vgs to drive the light-emitting element EL. The driving element DT may include the gate electrode connected to the second node n2, the first electrode connected to the first node n1, and the second electrode connected to the third node n3.

During the initialization period Tini, the $(N-1)^{th}$ scan pulse SCAN(N-1) may be generated as the gate-on voltage VGL. The $N^{th}$ scan pulse SCAN(N) and the EM pulse EM(N) may maintain the gate-off voltages VGH and VEH during the initialization period Tini. Therefore, during the initialization period Tini, the fifth switching element M5 may be turned on and the second node n2 may be initialized to the initialization voltage Vini. When the fifth and sixth switching elements M5 and M6 are turned on during the initialization period Tini, the second and fourth nodes n2 and n4 may be initialized to the initialization voltage Vini.

A holding period Th may be set between the initialization period Tini and the sampling period Tsam and between the sampling period Tsam and the emission period Tem. In the holding period Th, the scan pulses SCAN(N−1) and SCAN (N) and the EM pulse EM(N) may be the gate-off voltages VGH, and the main nodes n1 to n4 of the pixel circuit may be floated.

During the sampling period Tsam, the $N^{th}$ scan pulse SCAN(N) may be generated as the gate-on voltage VGL. A pulse of the $N^{th}$ scan pulse SCAN(N) may be synchronized with the data voltage Vdata of the pixel data to be written in the subpixels of the $N^{th}$ pixel line. The $(N-1)^{th}$ scan pulse SCAN(N−1) and the EM pulse EM(N) may be the gate-off voltages VGH and VEH during the sampling period Tsam. Therefore, during the sampling period Tsam, the first and second switching elements M1 and M2 may be turned on. In this case, the sixth switching element M6 may be also turned on to supply the initialization voltage Vini to the fourth node n4, and thus light emission of the light-emitting element EL can be prevented.

During the sampling period Tsam, a gate voltage DTG of the driving element DT may be increased by the current flowing through the first and second switching elements M1 and M2. In the sampling period Tsam, the threshold voltage Vth of the driving element DT may be sampled by the capacitor Cst.

During the emission period Tem, the EM pulse EM(N) may be generated as the gate-on voltage VGL. During the emission period Tem, the voltage of the EM pulse EM(N) may be inverted by a predetermined duty ratio. Therefore, the EM pulse EM(N) may be generated as the gate-on voltage VGL during at least a portion of the emission period Tem.

When the EM pulse EM(N) is the gate-on voltage VEL, a current flows between the pixel driving voltage ELVDD and the light-emitting element EL, and thus the light-emitting element EL may emit light. During the emission period Tem, the $(N-1)^{th}$ and $N^{th}$ scan pulses SCAN(N−1) and SCAN(N) may be the gate-off voltages VGH. During the emission period Tem, the third and fourth switching elements M3 and M4 may be turned on according to the gate-on voltage VEL of the EM pulse EM(N). When the EM pulse EM(N) is the gate-on voltage VEL, the third and fourth switching elements M3 and M4 may be turned on and the current may flow through the light-emitting element EL. During the emission period Tem, the current flowing through the light-emitting element EL is $K(ELVDD-Vdata)^2$. K denotes a constant value determined by charge mobility, parasitic capacitance, and channel capacitance of the driving element DT.

Figure 6:
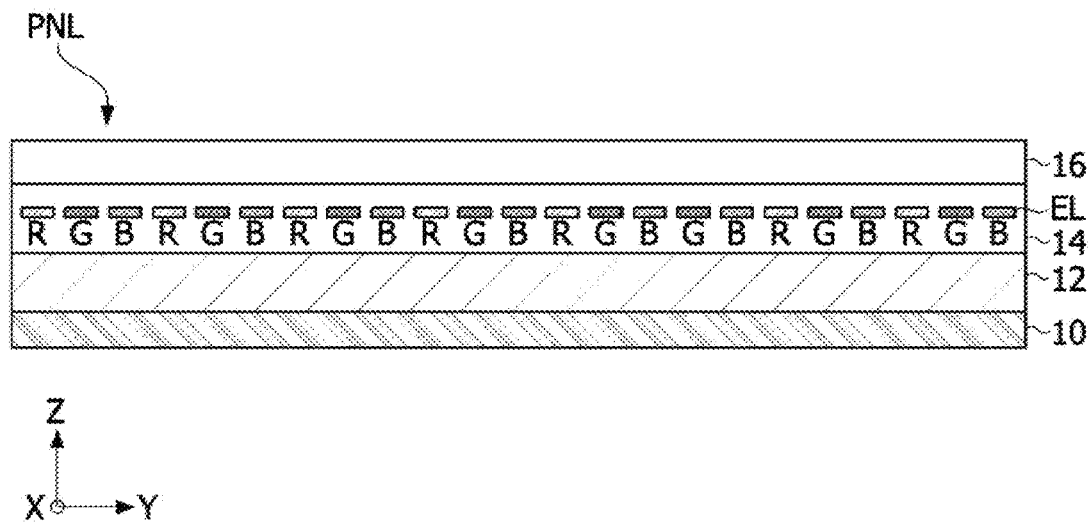
FIGS. 6 to 8 are cross-sectional views illustrating various structures of display panels according to example embodiments of the present disclosure.
Figure 7:
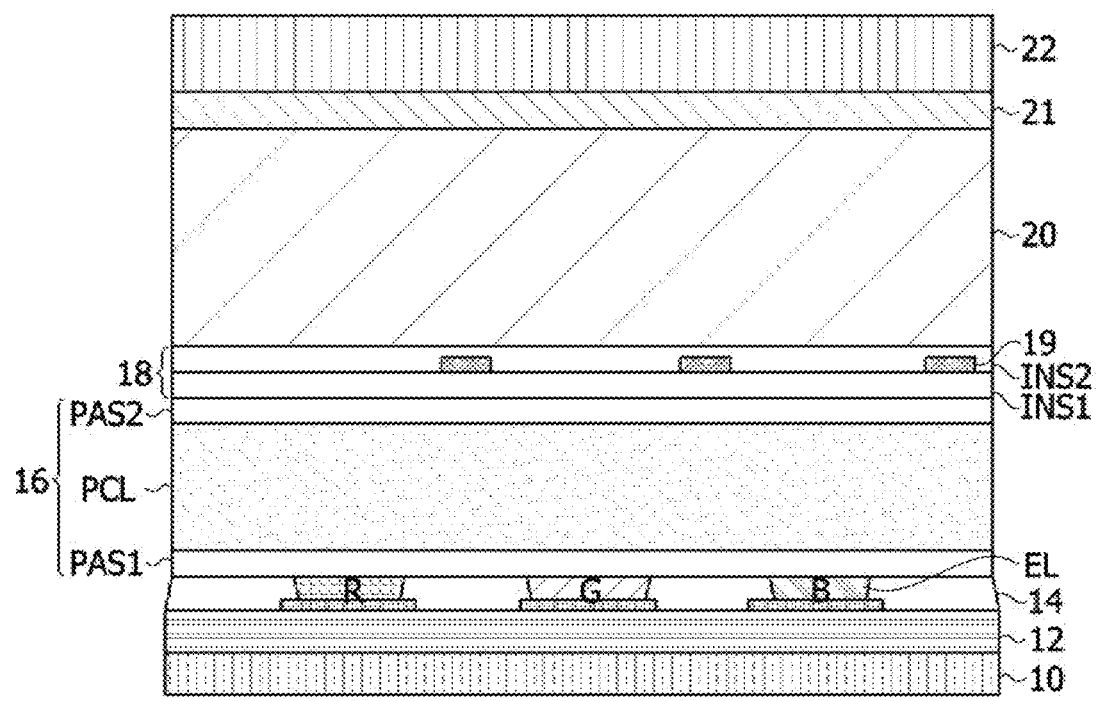
Figure 8:
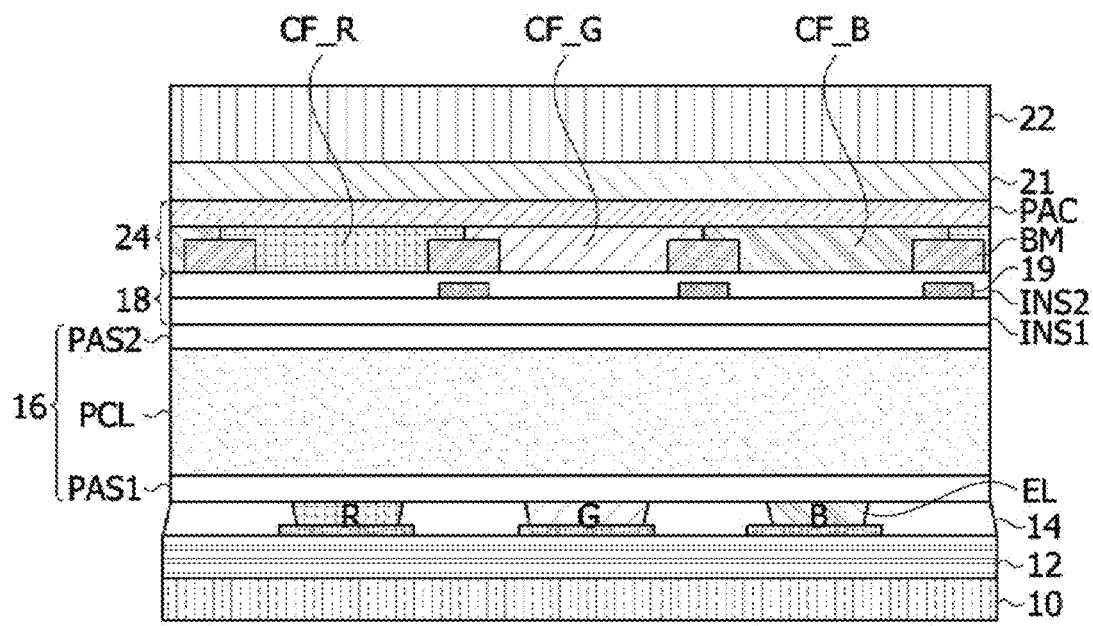

FIGS. 6 to 8 are cross-sectional views illustrating various structures of display panels according to example embodiments of the present disclosure.

Referring to FIG. 6, a display panel PNL may include a circuit layer 12, a light-emitting element layer 14, and an encapsulation layer 16, which are stacked on a substrate 10.

The circuit layer 12 may include pixel circuits connected to interconnections such as data lines, gate lines, power lines, and the like, a gate driver GIP connected to the gate lines, and the like. The interconnections and circuit elements of the circuit layer 12 may include a plurality of insulating layers, two or more metal layers separated from each other with the insulating layers interposed therebetween, and an active layer including a semiconductor material.

The light-emitting element layer 14 may include light-emitting elements EL driven by the pixel circuits. The light-emitting element EL may include red (R) light-emitting elements, green (G) light-emitting elements, and blue (B) light-emitting elements. In another embodiment, the light-emitting element layer 14 may include a white light-emitting element and a color filter. The light-emitting elements EL of the light-emitting element layer 14 may be covered by a protective layer including an organic film and a protective film.

The encapsulation layer 16 may cover the light-emitting element layer 14 to seal the circuit layer 12 and the light-emitting element layer 14. The encapsulation layer 16 may have a multi-insulating film structure in which an organic film and an inorganic film are alternately stacked. The inorganic film may block the penetration of moisture or oxygen. The organic film may planarize a surface of the inorganic film. When the organic film and the inorganic film are stacked in multiple layers, a movement path of the moisture or oxygen becomes longer than when the organic film and the inorganic film are formed as a single layer, and thus the penetration of moisture/oxygen affecting the light-emitting element layer 14 can be effectively blocked.

Referring to FIG. 7, a display panel PNL may further include a touch sensor layer 18 formed on an encapsulation layer 16.

In the encapsulation layer 16, an inorganic film PAS1, an organic film PCL, and an inorganic film PAS2 may be stacked. The touch sensor layer 18 may be disposed on the inorganic film PAS2 of the encapsulation layer 16.

The touch sensor layer 18 may include capacitive touch sensors that detect a touch input on the basis of a change in capacitance before and after the touch input. The touch sensor layer 18 may include metal interconnection patterns 19 and insulating films INS1 and INS2 which form the capacitance of the touch sensors. The capacitance of the touch sensor may be formed between the metal interconnection patterns 19. The insulating films INS1 and INS2 may insulate portions crossing the metal interconnection patterns 19 and planarize a surface of the touch sensor layer 18.

A polarizing plate 20 may be disposed on the touch sensor layer 18. The polarizing plate 20 may convert polarization of external light reflected by a metal of the touch sensor layer 18 and the circuit layer 12, and thus visibility and a contrast ratio can be improved. The polarizing plate 20 may be implemented as a polarizing plate in which a linear polarizing plate and a phase delay film are bonded, or a circular polarizing plate. A cover glass 22 may be adhered onto the polarizing plate 20. In FIG. 7, reference numeral "21" indicates an adhesive for bonding the cover glass 22. The adhesive 21 may be an optically transparent adhesive (OCA).

In a display panel PNL illustrated in FIG. 8, a polarizing plate 20 is removed, and a color filter layer 24 is added.

Referring to FIG. 8, the display panel PNL may further include a touch sensor layer 18 formed on an encapsulation layer 16, and the color filter layer 24 formed on the touch sensor layer 18.

The color filter layer 24 may include red, green, and blue filters CF_R, CF_G, and CF_B. The color filter layer 24 may further include a black matrix pattern BM. The color filter layer 24 may absorb light of some wavelengths reflected by the circuit layer 12 and the touch sensor layer 18 to serve as a polarizing plate, and thus color purity can be increased. In the present example embodiment, the color filter layer 24 having a higher light transmittance than the polarizing plate may be applied to the display panel PNL, and thus light transmittance of the display panel PNL can be improved, and the thickness and flexibility of the display panel PNL can be improved. The color filter layer 24 may include an organic film PAC that covers the color filters CF_R, CF_G, and CF_B and the black matrix pattern BM and planarize a surface of the color filter layer 24. The cover glass 22 may be adhered onto the organic film PAC of the color filter layer 24.

Figure 9:
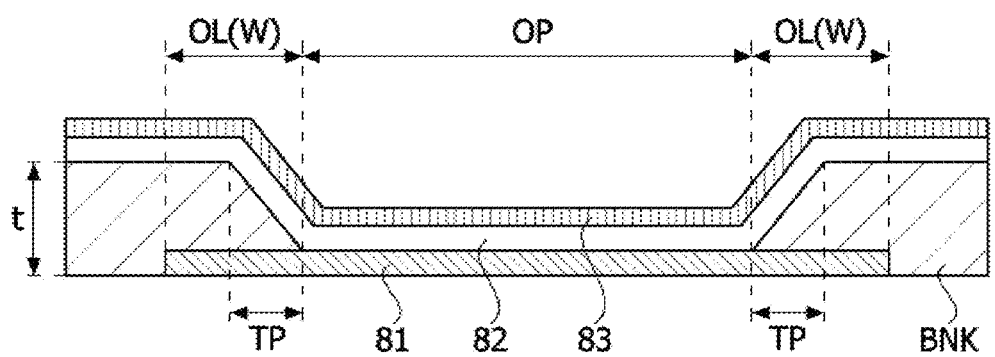
FIG. 9 is an example of a cross-sectional view illustrating a structure of a light-emitting element and a bank pattern.

A light-emitting element layer 14 may include a bank pattern that defines an emission region of a light-emitting element EL. FIG. 9 is an example of a cross-sectional view illustrating a structure of a light-emitting element EL and a bank pattern BNK.

Referring to FIG. 9, the light-emitting element EL may include an anode 81, an organic compound layer 82, and a cathode 83. The organic compound layer 82 may include a HIL, a HTL, an EML, an ETL, and an EIL.

The bank pattern BNK may define an emission region in each subpixel. The bank pattern BNK may include an opening OP covering an edge of the anode 81. In the opening OP of the bank pattern BNK, the anode 81 is exposed. The opening OP of the bank pattern BNK may have a circular shape, an elliptical shape, or a polygonal shape in a plan view.

The bank pattern BNK may be formed of an organic matter. The bank pattern BNK may include a tapered part OL formed at a boundary between the emission region and a non-emission region. The tapered part OL may include a tapered surface TP that overlaps the anode 81 and having a thickness t that decreases toward the opening OP. The tapered part OL may include a flat portion having a constant thickness t, but the present disclosure is not limited thereto. The tapered part OL may have a width W from an end of an electrode pattern of the anode 81 to the opening OP. The thickness t of the tapered part OL has a minimum value at a position in contact with the opening OP.

Figure 11:
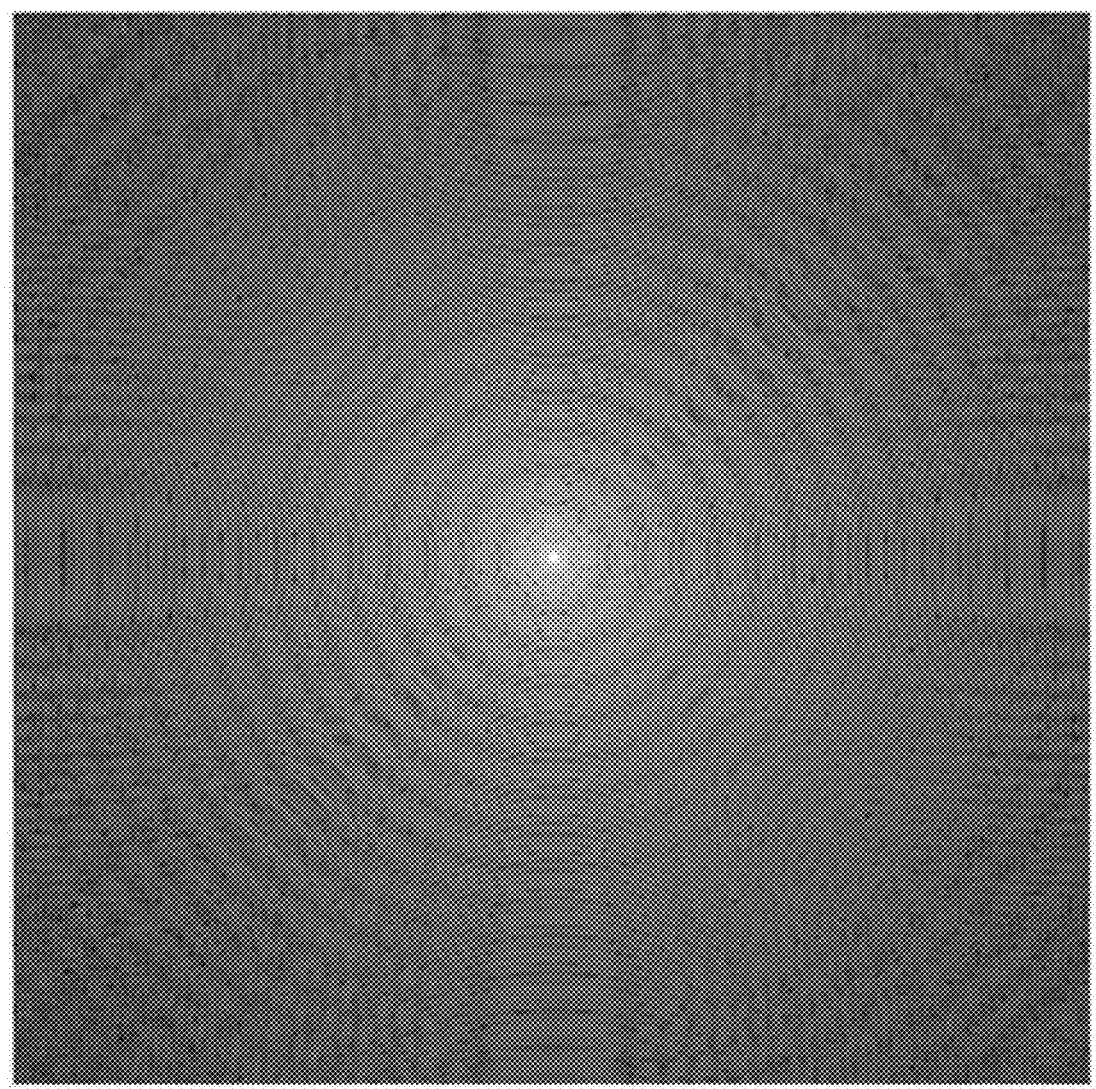
FIG. 11 is an example of an experiment result image showing interference fringes of a subpixel having the same bank pattern as in FIGS. 10A and 10B.

Interference fringes as shown in FIG. 11 may be visually recognized according to the shape of the bank pattern BNK.

Figure 10A:
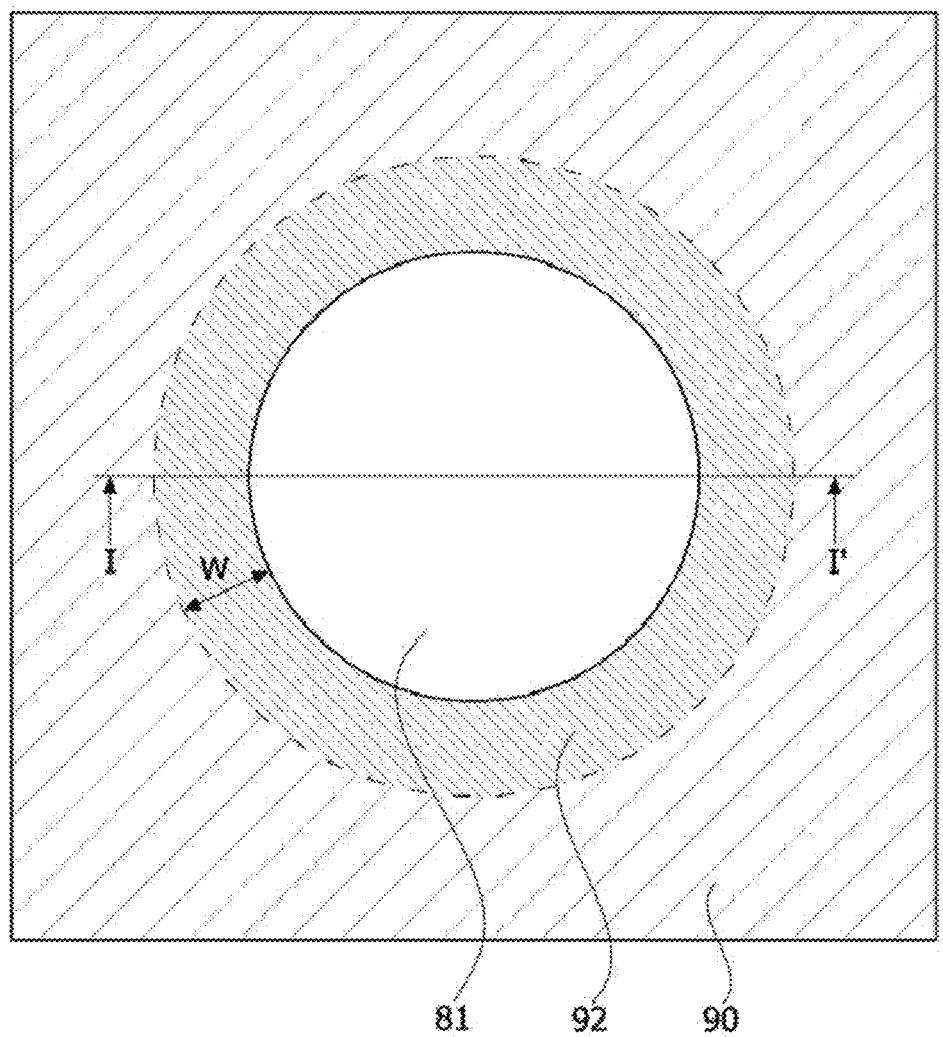
FIGS. 10A and 10B are examples of views illustrating a bank pattern in which interference fringes are visually recognized.
Figure 10B:
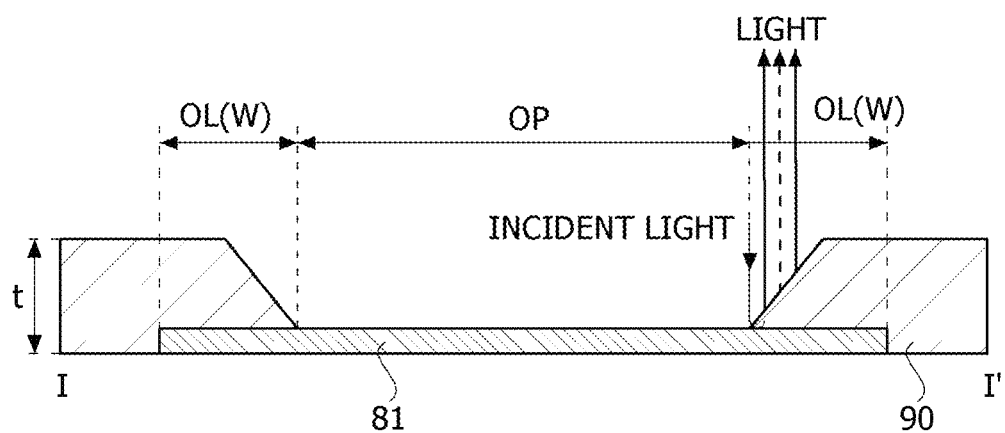

FIGS. 10A and 10B are examples of views illustrating a bank pattern 90 in which interference fringes are visually recognized. FIG. 10B is an example of a cross-sectional view along line I-I' in FIG. 10A.

Referring to 10A and 10B, when a width W and a slope angle of a tapered part 92 of the bank pattern 90 are constant, interference fringes may be seen. This is because, when light is reflected by the tapered part 92, constructive interference and destructive interference of the light reflected by the tapered part 92 appear at regular intervals.

FIG. 11 shows an example of an experimental result of light reflected by a subpixel having the same bank pattern 90 as in FIGS. 10A and 10B. As can be seen in FIG. 11, a constructive interference region and a destructive interference region are spatially separated in the bank pattern 90 illustrated in FIGS. 10A and 10B, and thus interference fringes in the form of concentric circles may be seen.

In the display panel of one or more example embodiments of the present disclosure, at least one of a width and a slope angle of a tapered part OL of the bank pattern within the subpixel is partially differently or irregularly set, and thus interference fringes caused by constructive interference and destructive interference of light reflected by the tapered part OL are prevented.

Figure 12:
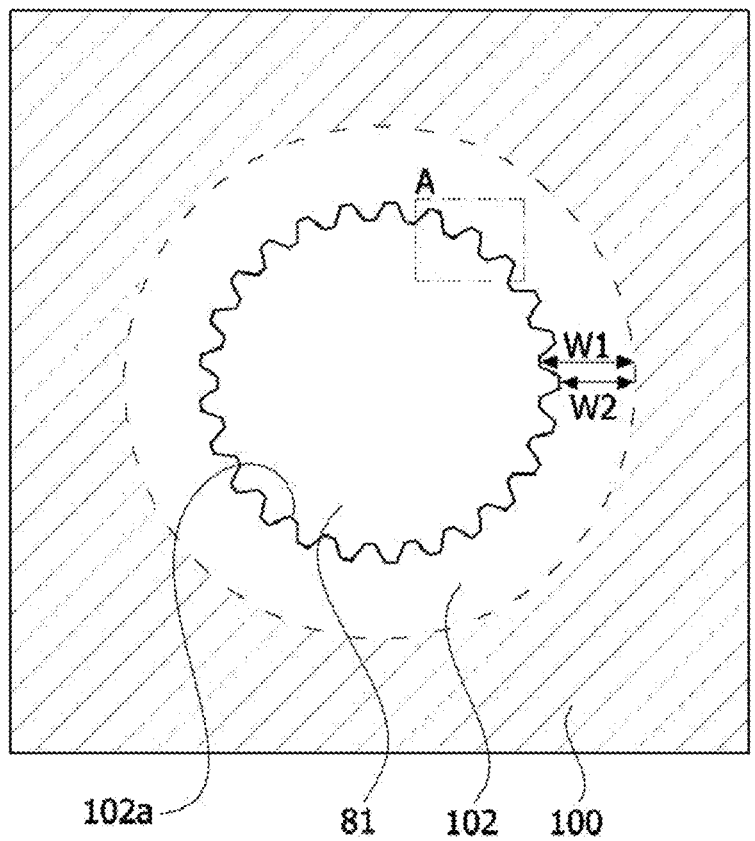
FIG. 12 is a plan view illustrating a bank pattern according to an example embodiment of the present disclosure.
Figure 13:
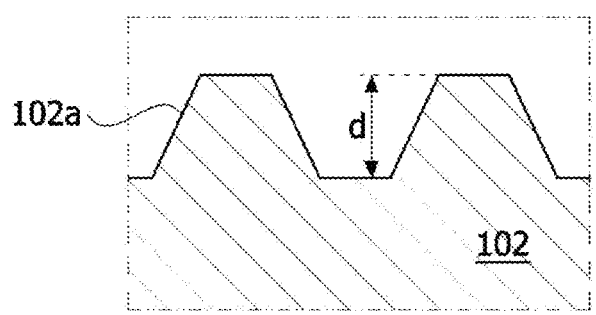
FIG. 13 is an example of an enlarged view of part "A" in FIG. 12.
Figure 14A:
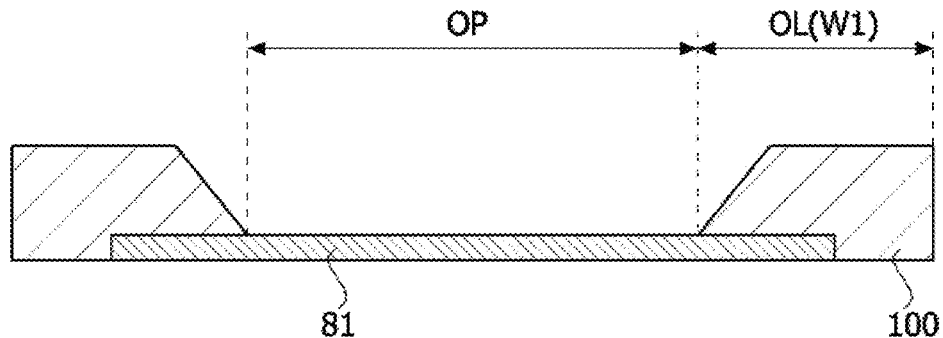
FIG. 14A is an example of a cross-sectional view illustrating a convex part of an uneven pattern illustrated in FIG. 12.
Figure 14B:
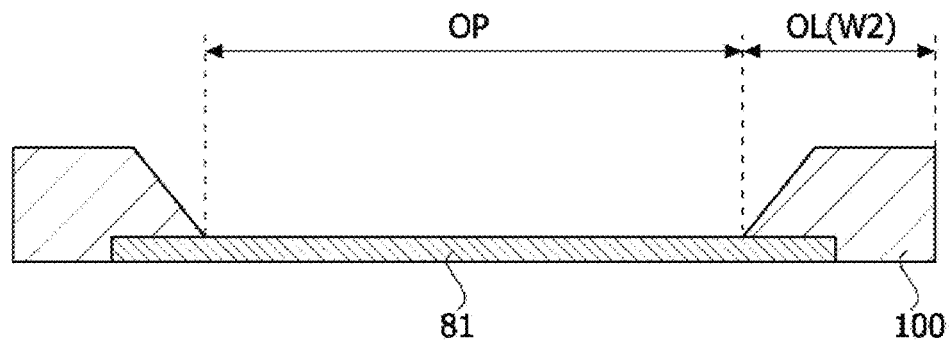
FIG. 14B is an example of a cross-sectional view illustrating a concave part of the uneven pattern illustrated in FIG. 12.

FIG. 12 is a plan view illustrating a bank pattern according to an example embodiment of the present disclosure. FIG. 13 is an example of an enlarged view of part "A" in FIG. 12. FIG. 14A is an example of a cross-sectional view illustrating a convex part (or  part) of an uneven pattern illustrated in FIG. 12. FIG. 14B is an example of a cross-sectional view illustrating a concave part (or  part) of the uneven pattern illustrated in FIG. 12.

Referring to FIGS. 12 to 14B, a tapered part 102 of a bank pattern 100 may include an uneven pattern 102a adjacent to an opening OP.

The uneven pattern 102a may make widths W1 and W2 of the tapered part 102 different regularly or irregularly. The uneven pattern 102a of the tapered part 102 may be formed to correspond to a shape of a light-blocking part of a photomask in a photolithography process. The tapered part 102 may have a first width W1 at a convex part of the uneven pattern 102a, and have a second width W2 smaller than the first width W at a concave part of the uneven pattern 102a. A degree of change in the width of the tapered part 102 may be determined by a depth d of the concave part of the uneven pattern 102a.

Figure 15:
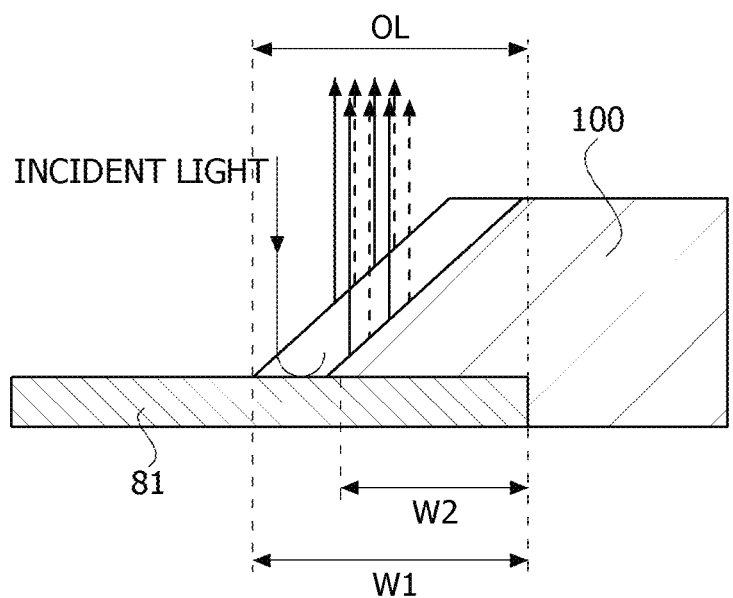
FIG. 15 is an example of a schematic view illustrating light reflected by a tapered part of a bank pattern illustrated in FIGS. 14A and 14B.
Figure 16:
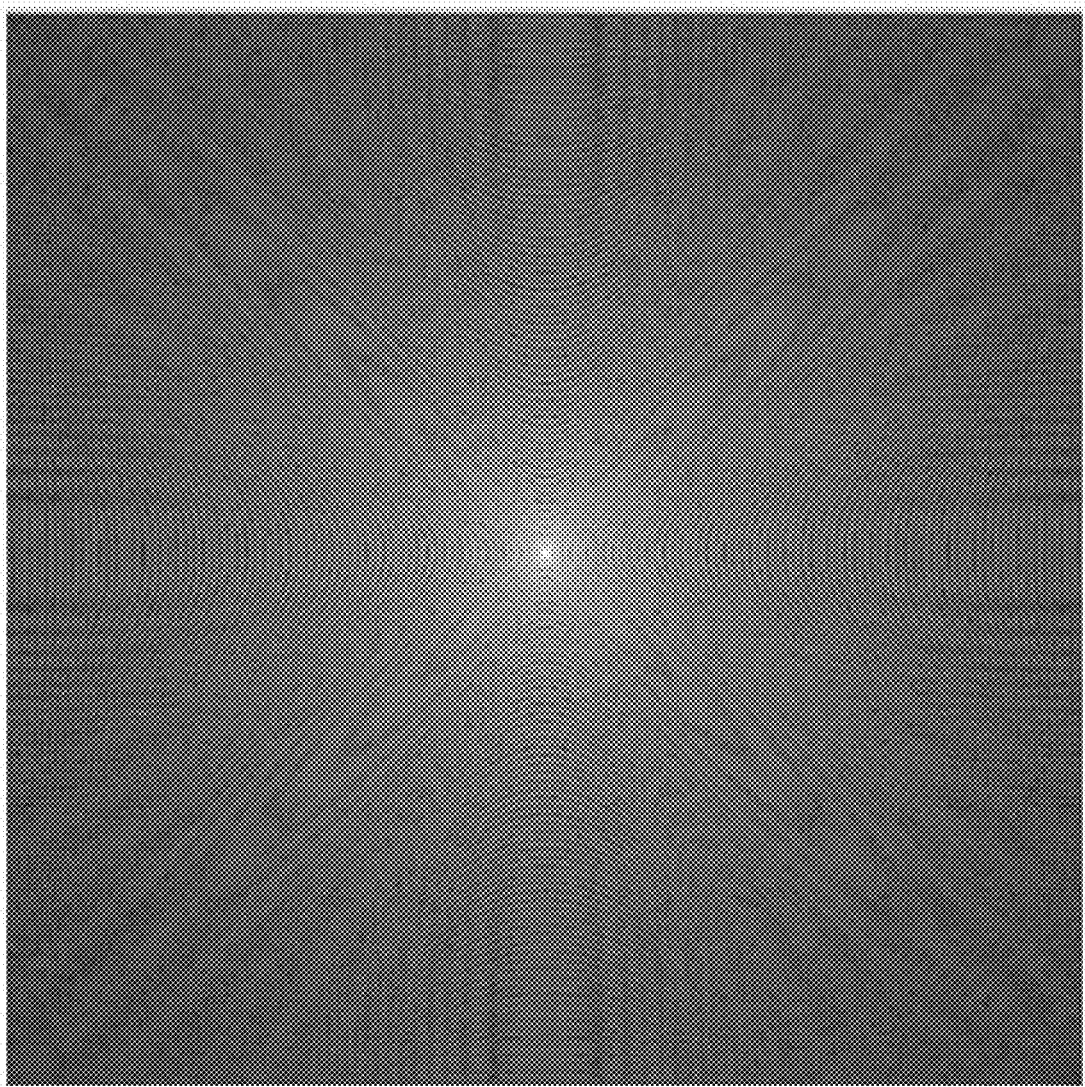
FIG. 16 is an example of an experiment result image showing light emitted from a subpixel having the same bank pattern as in FIGS. 14A and 14B.

As illustrated in FIG. 15, a constructive interference and a destructive interference of light reflected by a tapered part 102 having an uneven pattern 102a may be irregularly mixed. As a result, as can be seen from an experimental result of FIG. 16, a recognition level of an interference fringe pattern can be reduced.

Figure 17A:
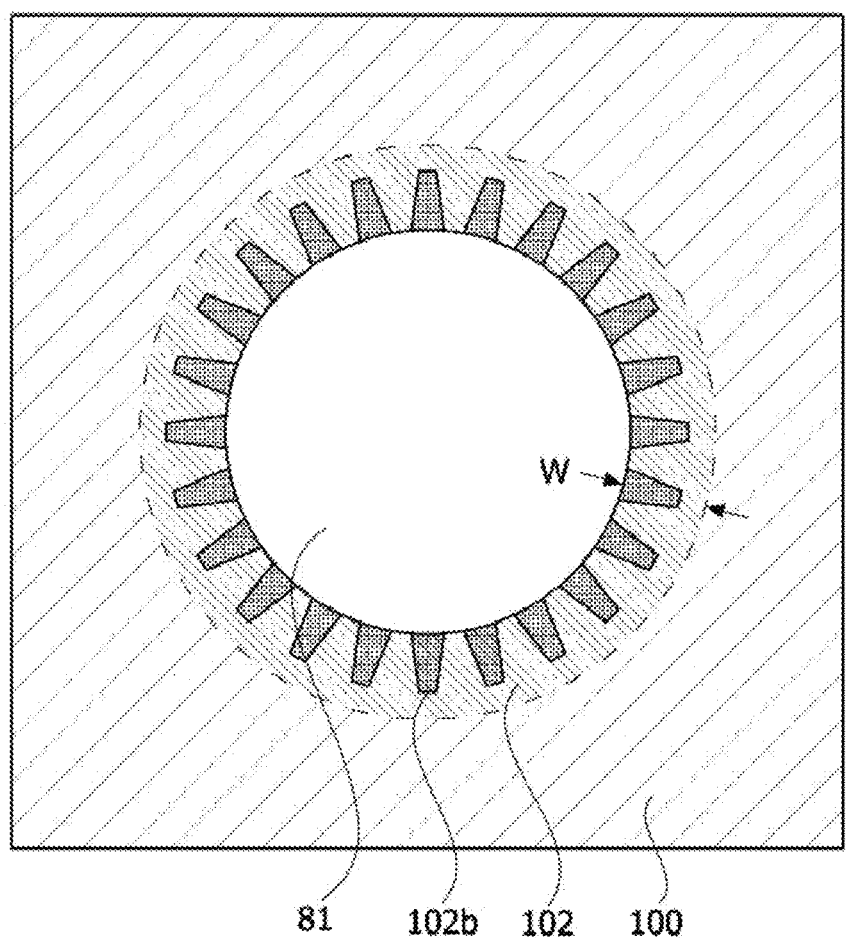
FIGS. 17A to 17C are a plan view and cross-sectional views illustrating a structure of a bank pattern according to another example embodiment of the present disclosure.
Figure 17B:
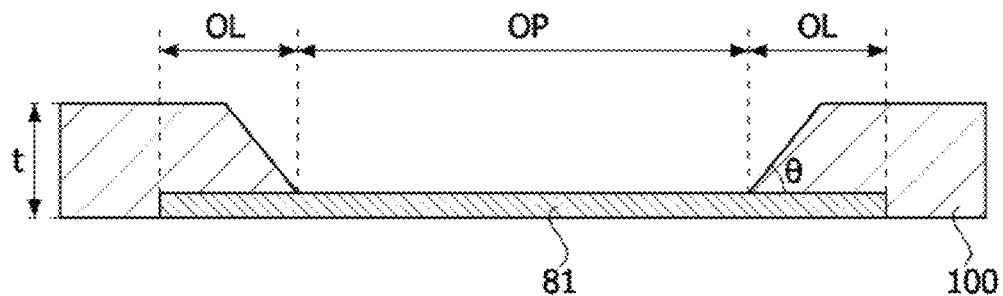
Figure 17C:
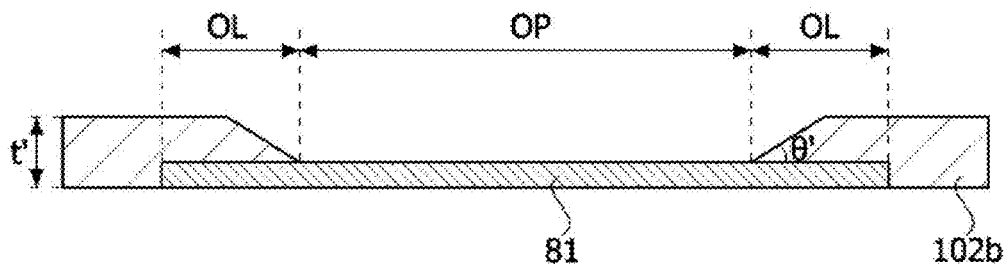

FIGS. 17A to 17C are a plan view and cross-sectional views illustrating a structure of a bank pattern according to another example embodiment of the present disclosure. FIG. 17A is an example of a plan view illustrating a bank pattern and an anode. FIGS. 17B and 17C are examples of cross-sectional views illustrating portions of a tapered part of the bank pattern with different angles.

Referring to FIGS. 17A to 17C, a tapered part 102 of a bank pattern 100 may include an engraved pattern 102b adjacent to an opening OP.

The engraved pattern 102b may make a slope angle of the tapered part partially different. A width of the tapered part 102 in which the engraved pattern 102b is present and a width W of the tapered part 102 in which the engraved pattern 102b is not present may be the same or different.

In a photolithography process, a photomask having a half-tone may be used. Such a photomask may include a light-transmitting part that transmits light with a high transmittance, a light-blocking part that blocks light, and a half-tone part through which light is transmitted with a transmittance lower than that of the light-transmitting part. In the half-tone part, the slope angle of the bank pattern may be adjusted according to an exposure amount, and thus the engraved pattern 102b may be formed in the tapered part 102. As illustrated in FIGS. 17B and 17C, when the slope angle of the tapered part 102 in a portion in which the engraved pattern 102b is not present is θ, the slope angle of the tapered part 102 in the engraved pattern 102b is reduced to θ'. A thickness of the tapered part 102 in the engraved pattern 102b may be reduced to t'.

Figure 18:
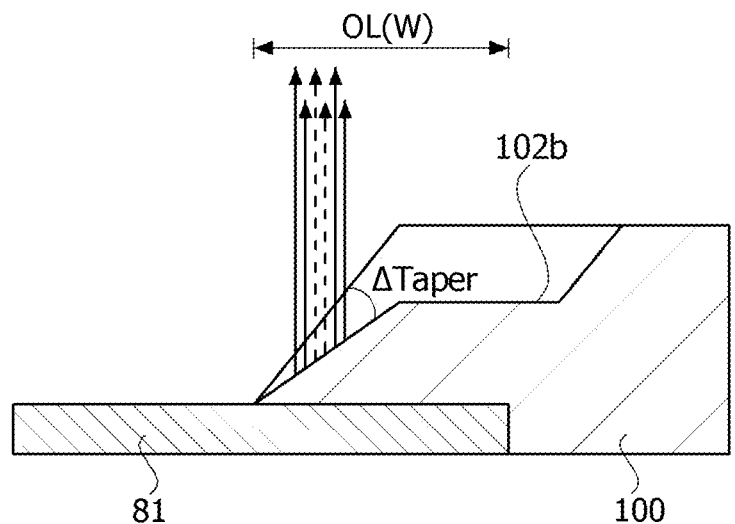
FIG. 18 is an example of a schematic view illustrating light reflected by a tapered part of the bank pattern illustrated in FIGS. 17A to 17C.

As illustrated in FIG. 18, a constructive interference and a destructive interference of light reflected by a tapered part 102 having an engraved pattern 102b may be irregularly mixed. As a result, a recognition level of an interference fringe pattern can be reduced.

Figure 19A:
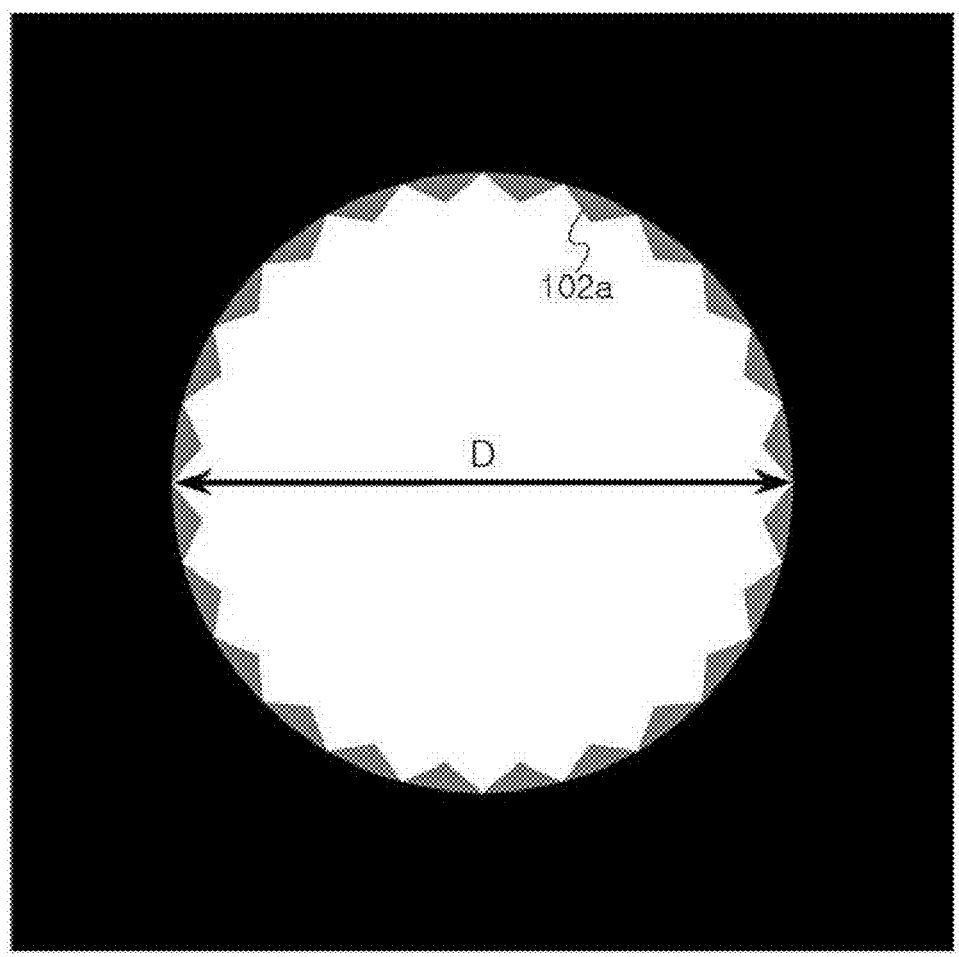
FIGS. 19A to 21B are examples of plan views illustrating subpixels having different widths of uneven patterns compared to diameters of openings of bank patterns, and examples of experiment result images showing light emitted from the subpixels.
Figure 19B:
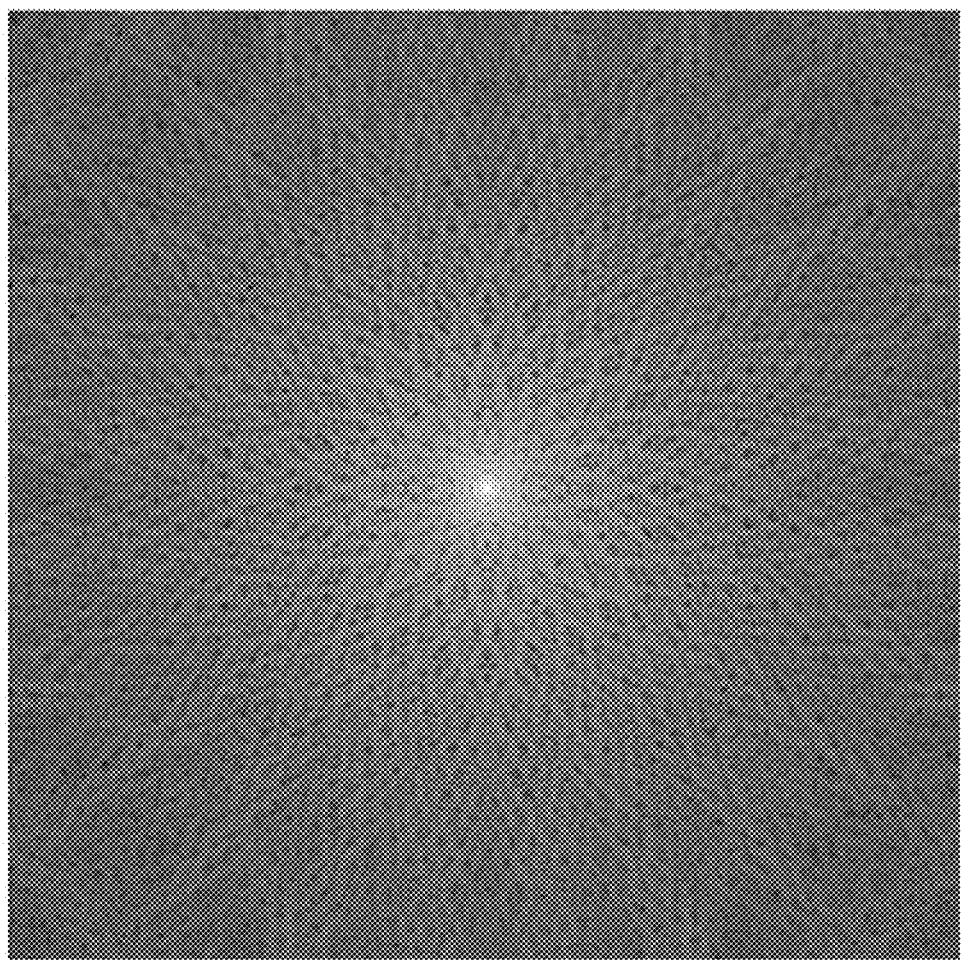
Figure 20A:
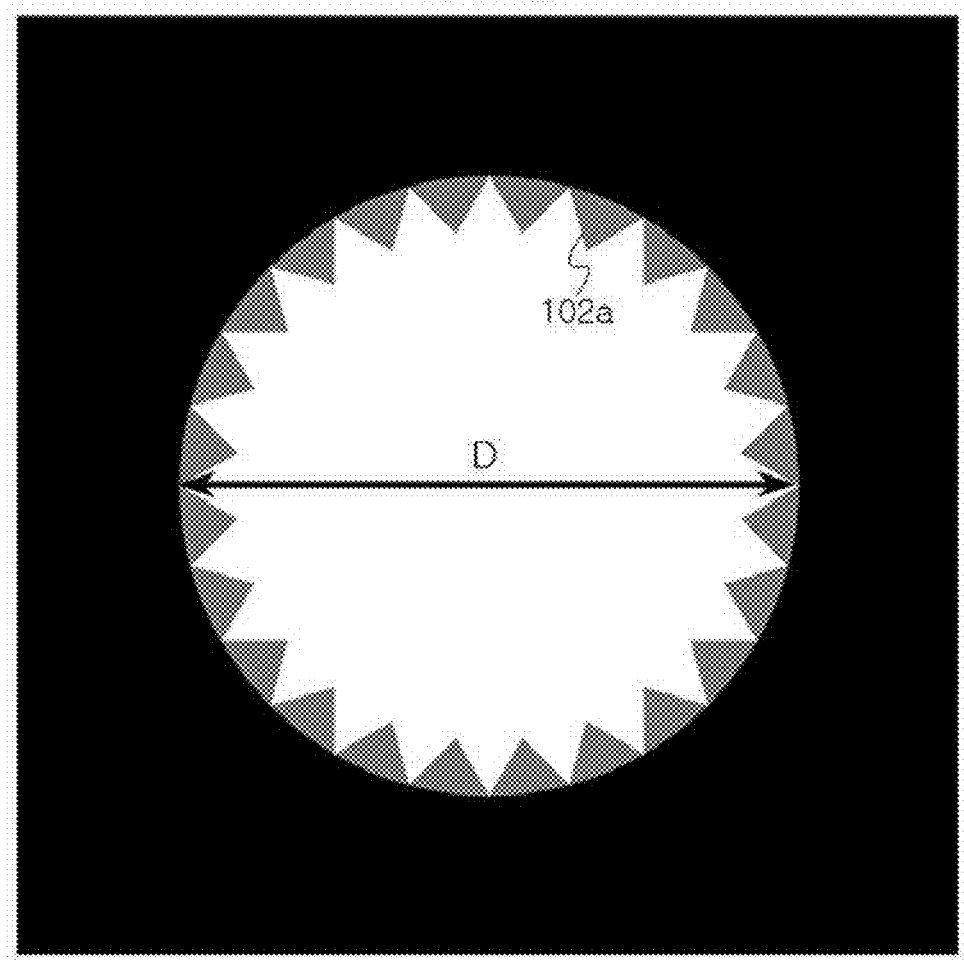
Figure 20B:
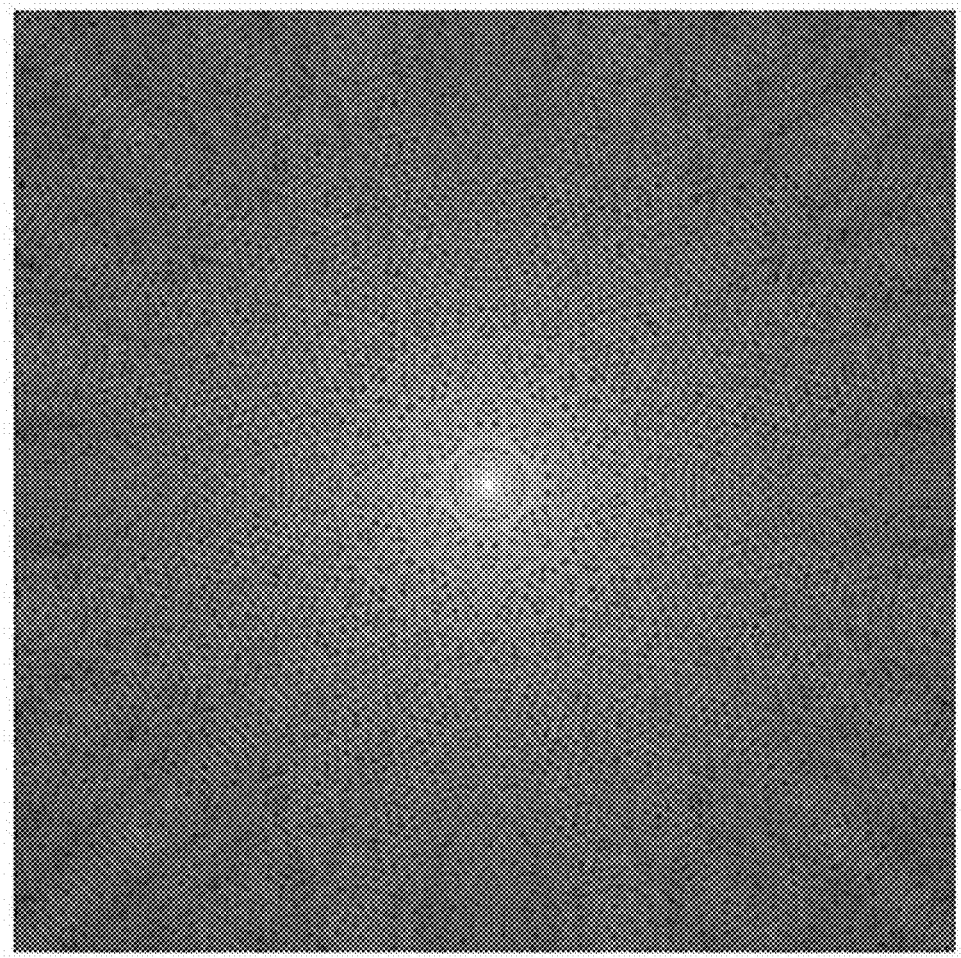
Figure 21A:
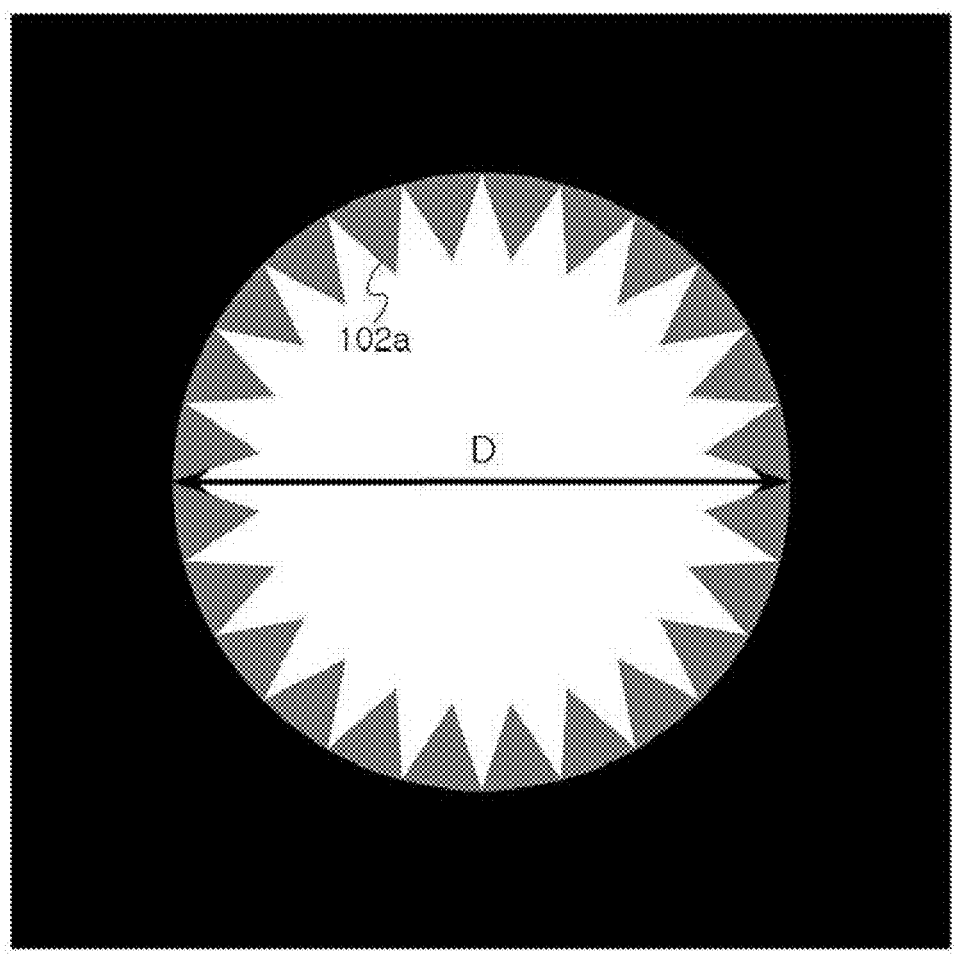
Figure 21B:
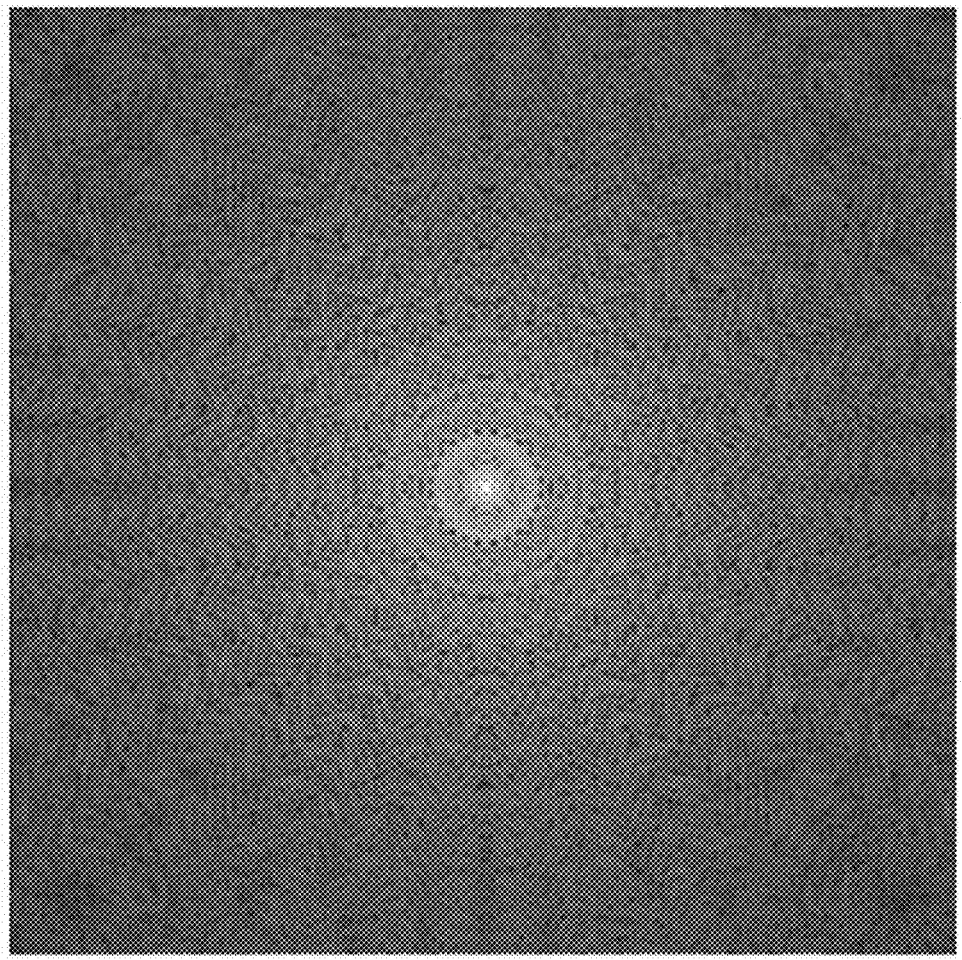

According to experimental results, it was confirmed that, when a width of an uneven pattern 102a of a tapered part 102 is set to 10% to 30% of a diameter D of an opening of a bank pattern 100, a recognition level of interference fringes is lowered without a significant change in a manufacturing process. When an opening OP has an elliptical or polygonal shape, a diameter D of the opening OP is a maximum diameter. FIG. 19A is an example of a plan view of a subpixel in which a width of an uneven pattern 102a is set to 10% (D*10%) of a diameter D of an opening of a bank pattern 100. FIG. 19B is an example of an experiment result image showing light emitted from the subpixel shown in FIG. 19A. FIG. 20A is an example of a plan view of a subpixel in which a width of an uneven pattern 102a is set to 20% (D*20%) of a diameter D of an opening of a bank pattern 100. FIG. 20B is an example of an experiment result image showing light emitted from the subpixel shown in FIG. 20A. FIG. 21A is an example of a plan view of a subpixel in which a width of an uneven pattern 102a is set to 30% (D*30%) of a diameter D of an opening of a bank pattern 100. FIG. 21B is an example of an experiment result image showing light emitted from the subpixel shown in FIG. 21A. As can be seen from the comparison of FIGS. 11, 19B, 20B, and 21B, it was confirmed that, when the width of the uneven pattern 102a is set in a range of 10% to 30% of the diameter D of the opening of the bank pattern 100, a recognition level of interference fringes is significantly lowered, and, in particular, when the width of the uneven pattern 102a is set to about 20% of the diameter D of the opening of the bank pattern 100, an interference fringe improvement effect is most excellent.

Figure 22A:
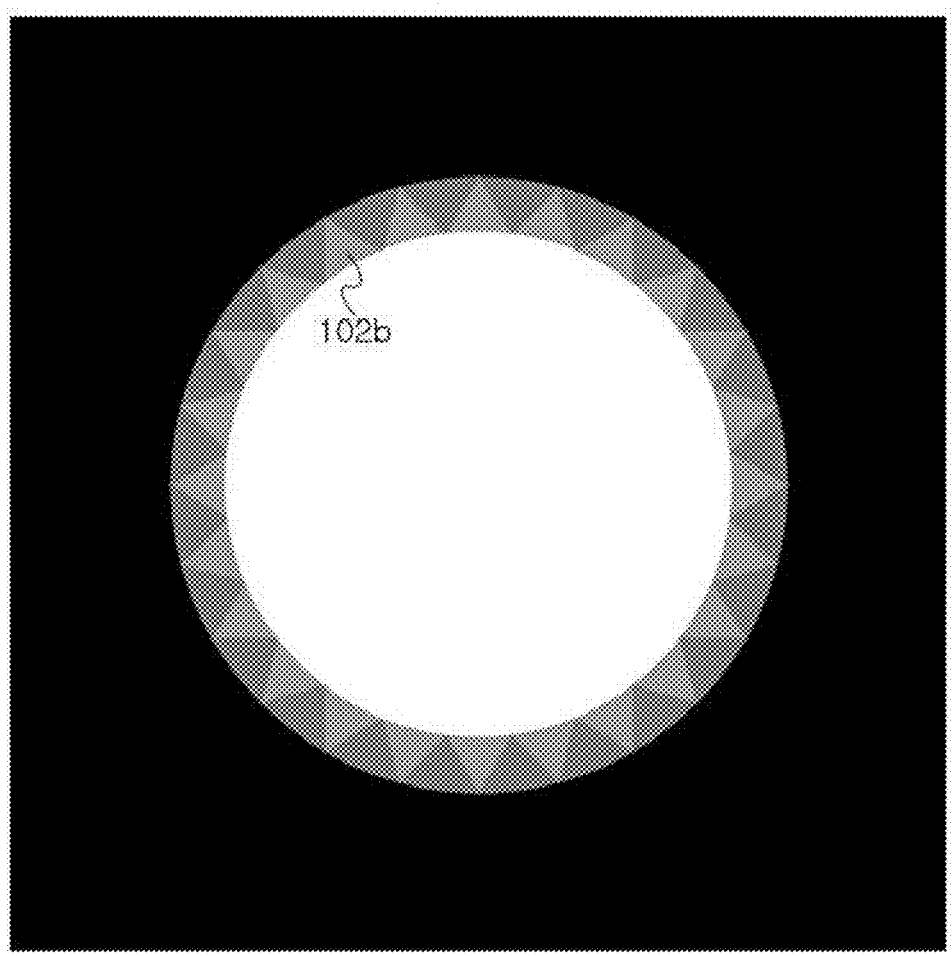
FIGS. 22A to 24B are examples of plan views illustrating subpixels having different slope angles of tapered parts, and examples of experiment result images showing light emitted from the subpixels.
Figure 22B:
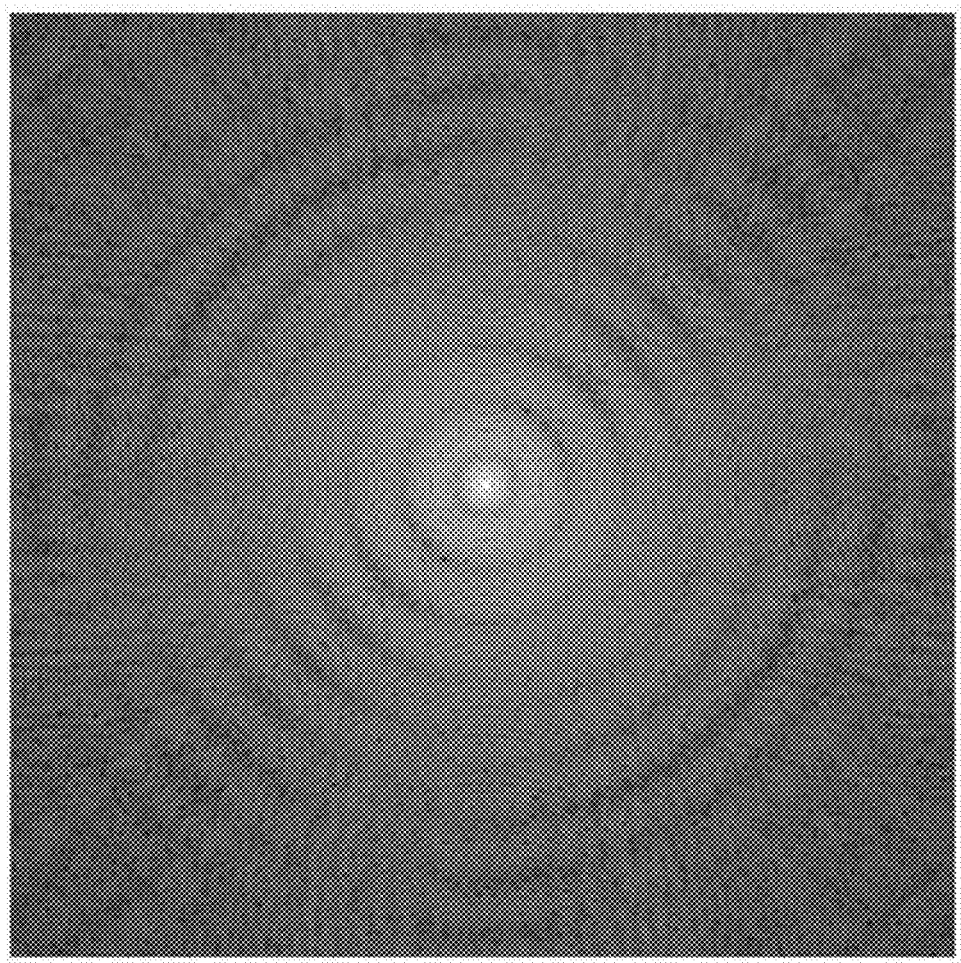
Figure 23A:
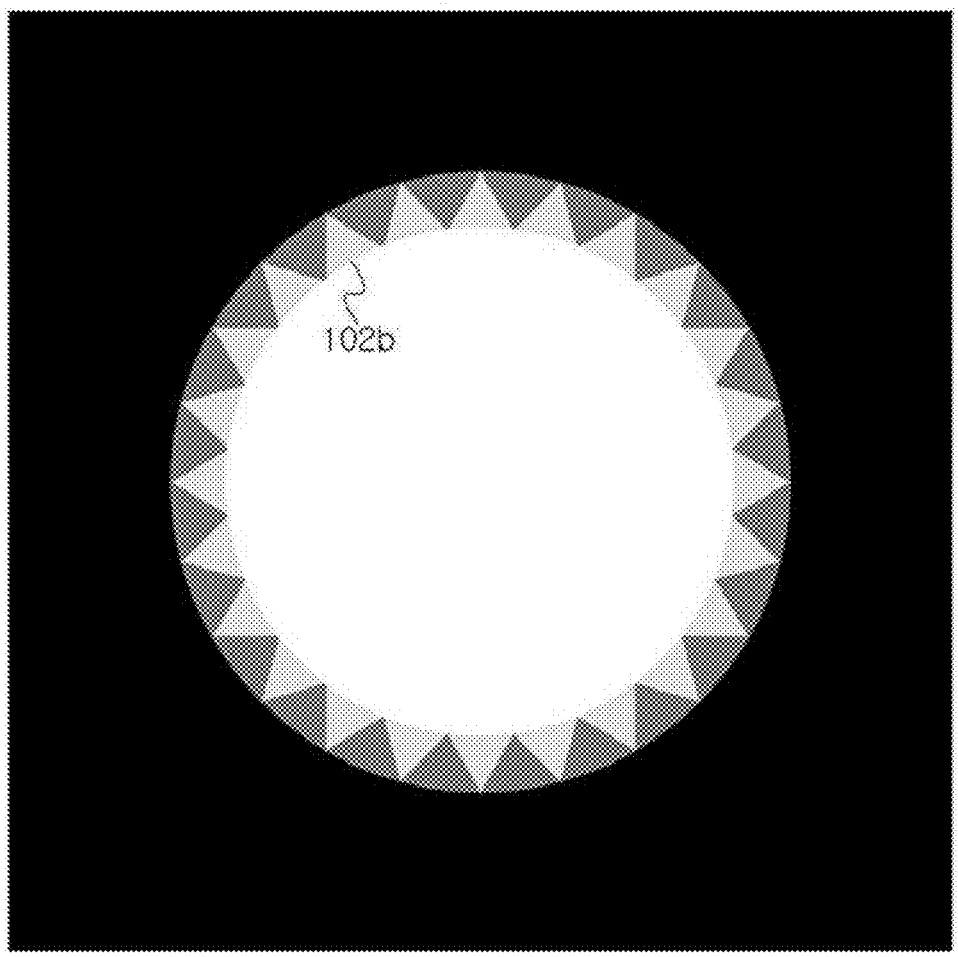
Figure 23B:
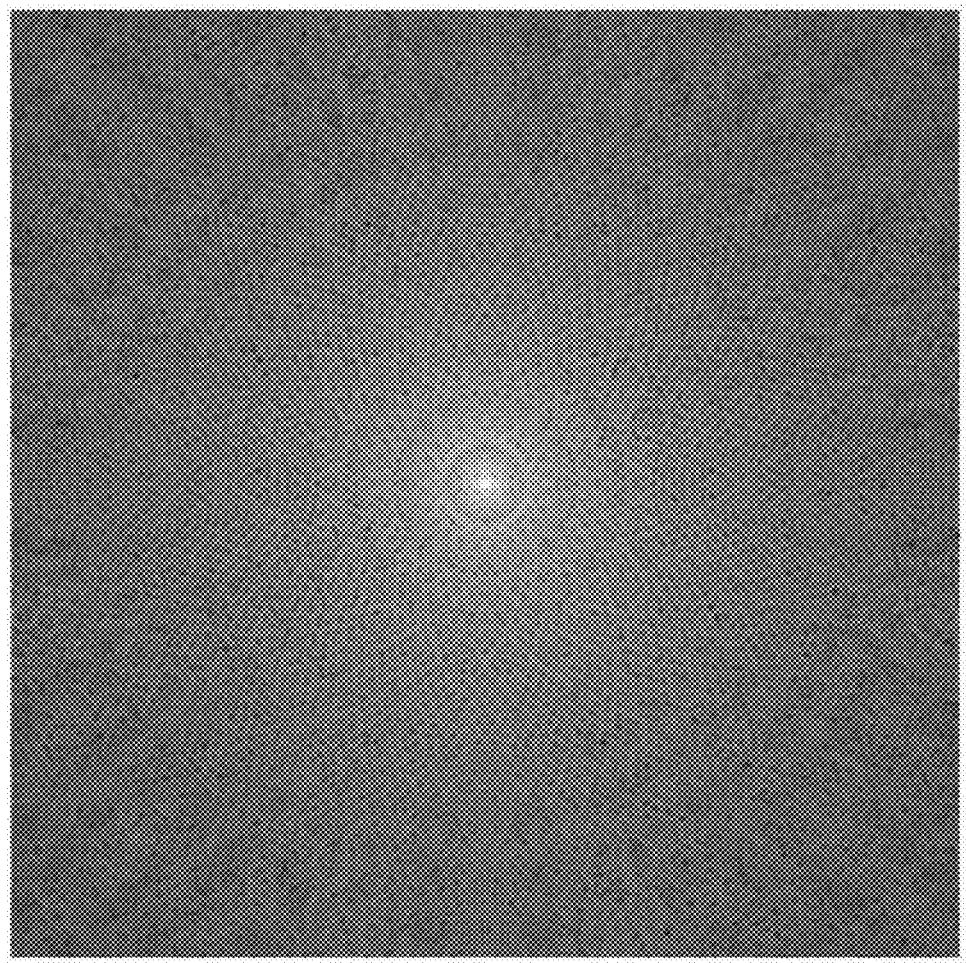
Figure 24A:
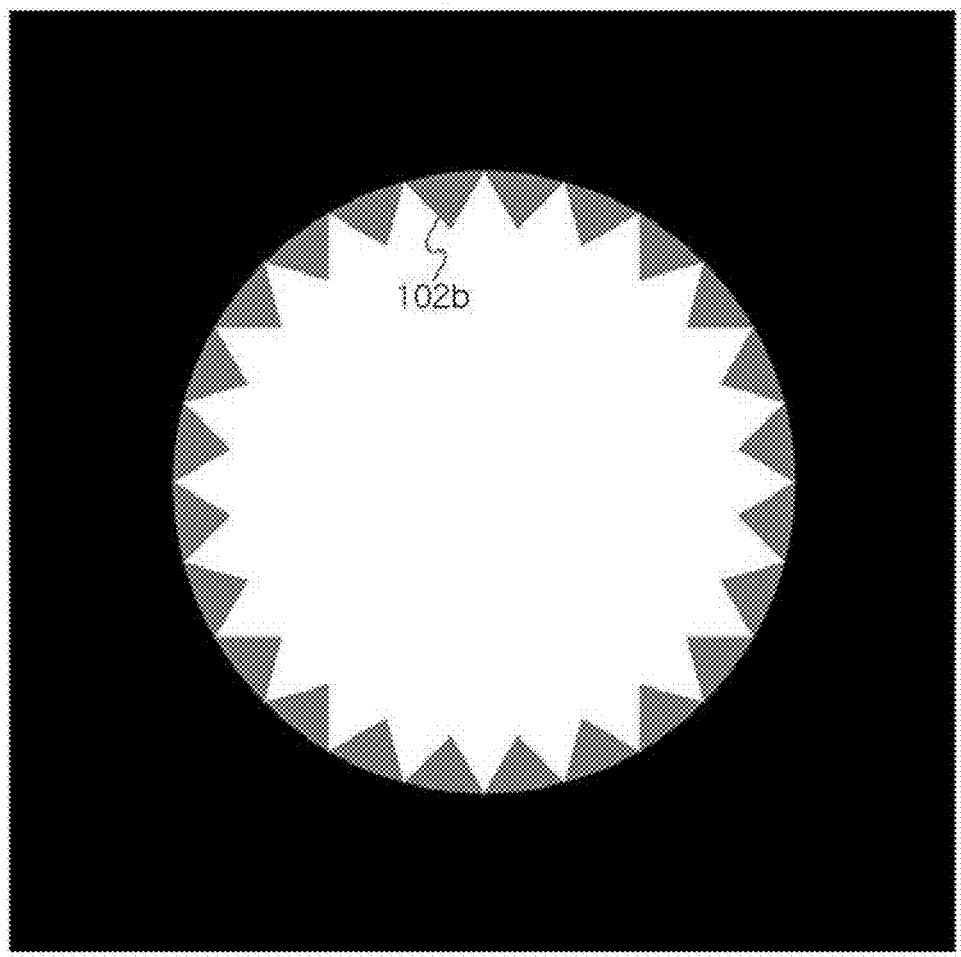
Figure 24B:
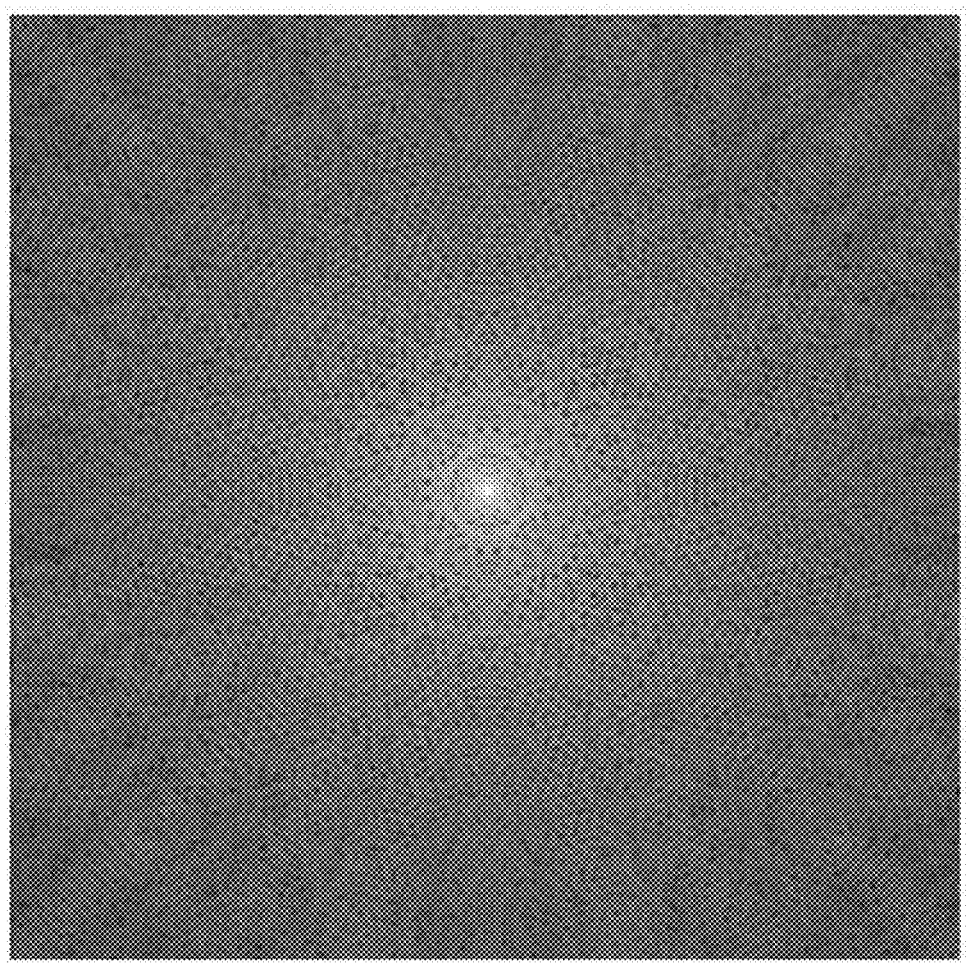

According to experimental results, it was confirmed that, when a difference ΔTaper (see FIG. 18) in the slope angle due to an engraved pattern 102b of a tapered part 102 is greater than 0° or less than or equal to 45°, a recognition level of interference fringes is lowered without a significant change in a manufacturing process. FIG. 22A is an example of a plan view of a subpixel in which a difference ΔTaper in slope angle of a tapered part 102 is set to 15°. In FIG. 22A, the slope angle in the case of no engraved pattern 102b was set to 45°, and the slope angle in the case of having the engraved pattern 102b was set to 30°. FIG. 22B is an example of an experiment result image showing light emitted from the subpixel shown in FIG. 22A. FIG. 23A is a plan view of a subpixel in which a difference ΔTaper in slope angle of a tapered part 102 is set to 30°. In FIG. 23A, the slope angle in the case of no engraved pattern 102b was set to 45°, and the slope angle in the case of having the engraved pattern 102b was set to 15°. FIG. 23B is an example of an experiment result image showing light emitted from the subpixel shown in FIG. 23A. FIG. 24A is an example of a plan view of a subpixel in which a difference ΔTaper in slope angle of a tapered part 102 is set to 45°. In FIG. 24A, the slope angle in the case of no engraved pattern 102b was set to 45°, and the slope angle in the case of having the engraved pattern 102b was set to 0°. FIG. 24B is an experiment result image showing light emitted from the subpixel shown in FIG. 24A. As can be seen from the comparison of FIGS. 11, 19B, 20B, 21B, 22B, 23B, and 24B, it was confirmed that, when the difference ΔTaper in the slope angle of the tapered part 102 is set to in a range of 15° to 45°, a recognition level of interference fringes is significantly lowered, and, in particular, when the difference ΔTaper in the slope angle of the tapered part 102 is set to about 30°, an interference fringe improvement effect is most excellent.

Figure 25A:
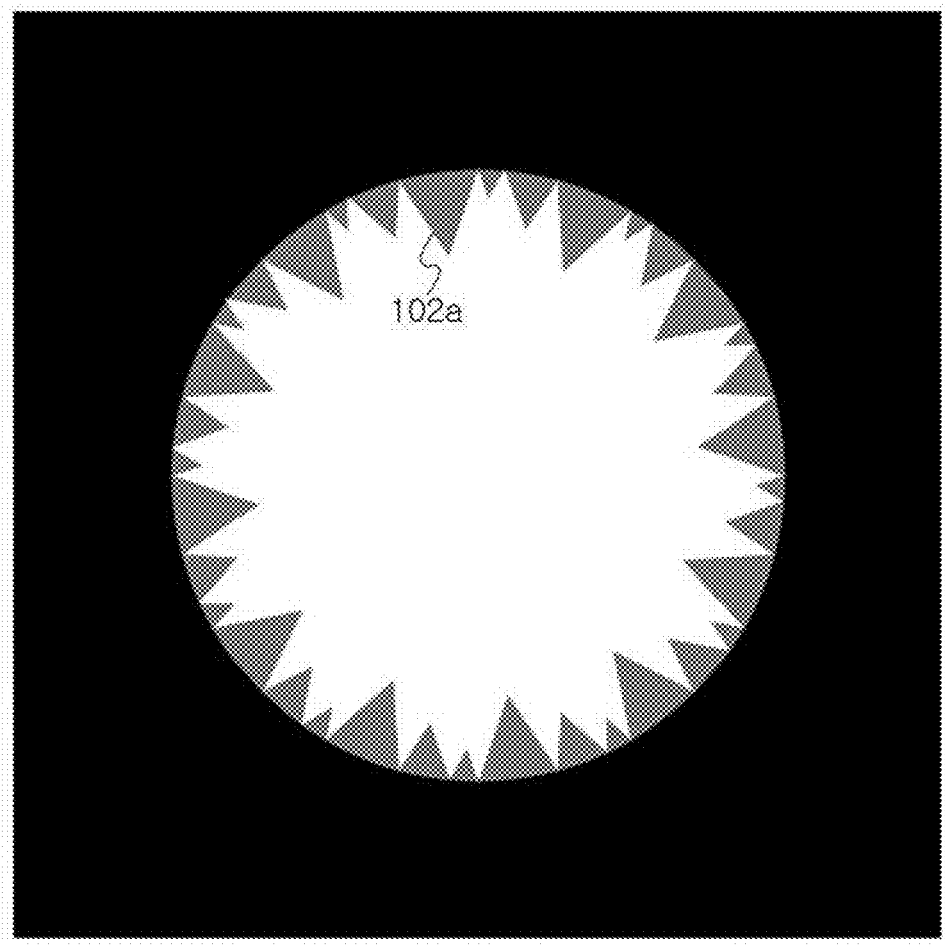
FIGS. 25A and 25B are an example of a plan view illustrating a subpixel in which an uneven pattern of a tapered part is formed in an irregular pattern, and an example of an experiment result image showing light emitted from the subpixel.
Figure 25B:
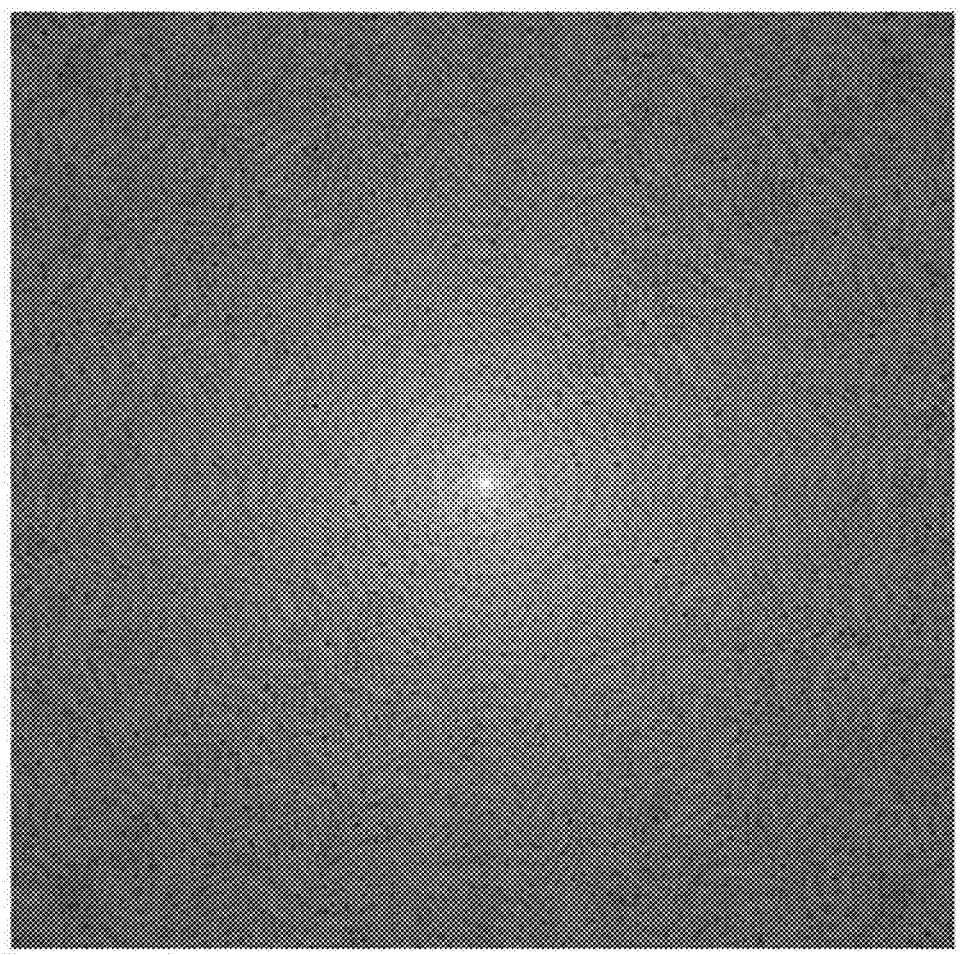

The uneven pattern 102a and the engraved pattern 102b of the tapered part 102 may be regularly or irregularly arranged within one subpixel. When the uneven pattern 102a and the engraved pattern 102b are irregularly arranged, an interference fringe reduction effect can be further improved. FIGS. 25A and 25B are an example of a plan view illustrating a subpixel in which an uneven pattern 102a of a tapered part is formed in an irregular pattern, and an example of an experiment result image showing light emitted from the subpixel.

The above-described embodiments may be variously combined. For example, the uneven pattern 102a and the engraved pattern 102b may be applied together to one subpixel, and the uneven pattern 102a and the engraved pattern 102b may be arranged regularly or irregularly.

Figure 26:
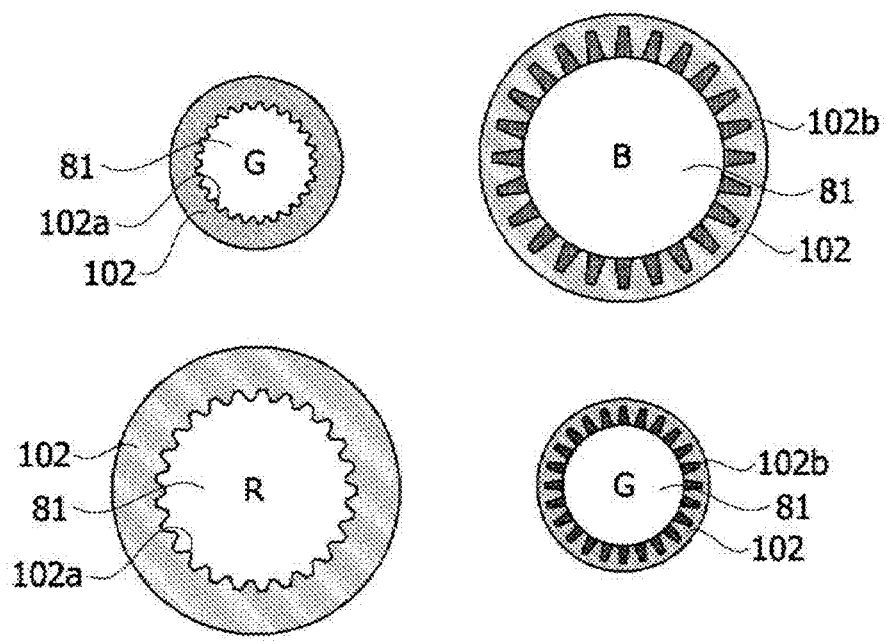
FIG. 26 is a view illustrating an example in which an uneven pattern and an engraved pattern are differently applied to subpixels of different colors.
Figure 27:
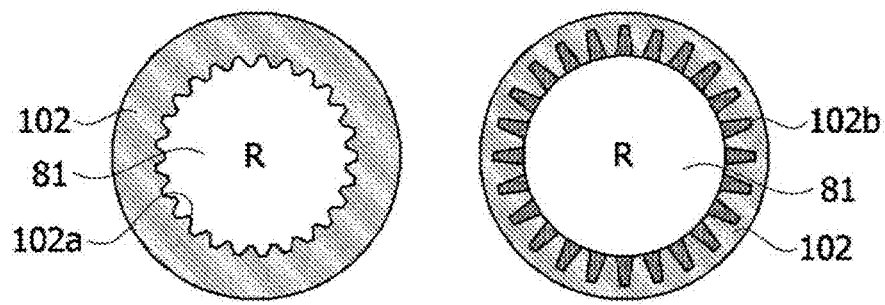
FIG. 27 is a view illustrating an example in which an uneven pattern and an engraved pattern are differently applied to subpixels of the same color.

As illustrated in FIG. 26, an uneven pattern 102a and an engraved pattern 102b may be differently applied to adjacent subpixels. FIG. 26 illustrates an example in which an uneven pattern 102a and an engraved pattern 102b are differently applied to subpixels of different colors R, G, and B, and FIG. 27 illustrates an example in which an uneven pattern 102a and an engraved pattern 102b are differently applied to subpixels of the same color R.

According to one or more example embodiments of the present disclosure, by partially differently setting at least one of a width and a slope angle of a tapered part of a bank pattern, a recognition level of interference fringes can be lowered. As a result, according to one or more example embodiments of the present disclosure, it is possible to prevent a phenomenon in which interference fringes of light reflected by the tapered part of the bank pattern in a display device is visually recognized.

In one or more aspects, the effects of embodiments of the present disclosure are not limited to the above-mentioned effects, and other effects that are not mentioned will be apparently understood by those skilled in the art from this disclosure including the appended claims.

In one or more aspects, the objects to be achieved by embodiments of the present disclosure, the means for achieving the objects, and effects of embodiments of the present disclosure described above do not specify essential features of the claims, and thus, the scope of the claims is not limited to the disclosure of the present disclosure.

Although the embodiments of the present disclosure have been described in more detail with reference to the accompanying drawings, the present disclosure is not limited thereto and may be embodied in many different forms without departing from the scope of the present disclosure. Therefore, the embodiments disclosed in the present disclosure are provided for illustrative purposes only and are not intended to limit the scope of the present disclosure. The scope of the present disclosure is not limited to the embodiments described herein. Therefore, it should be understood that the above-described embodiments are illustrative in all aspects and do not limit the present disclosure. The protective scope of the present disclosure should be construed based on the following claims, and the equivalent scope thereof should be construed as falling within the scope of the present disclosure. It will be apparent to those skilled in the art that various modifications and variations can be made in the present disclosure without departing from the scope of the present disclosure. Thus, it is intended that the present disclosure covers the modifications and variations of this disclosure provided they come within the scope of the appended claims and their equivalents.

What is claimed is:

1. A display panel, comprising:
    a circuit layer disposed on a substrate;
    a light-emitting element layer disposed on the circuit layer; and
    an encapsulation layer configured to cover the light-emitting element layer,
    wherein:
    the light-emitting element layer includes a bank pattern having an opening covering an edge of an electrode pattern;
    the bank pattern includes a tapered part having a width from an end of the electrode pattern to the opening of the bank pattern; and at least one of the width and a slope angle of the tapered part within a subpixel is partially differently set, wherein the tapered part of the bank pattern includes an uneven pattern, and wherein the uneven pattern has a width in a range of 10% to 30% of a diameter of the opening of the bank pattern.

2. The display panel of claim 1, wherein the uneven pattern has an irregular pattern.

3. The display panel of claim 1, further comprising: a touch sensor layer disposed on the encapsulation layer; and a polarizing plate disposed on the touch sensor layer.

4. The display panel of claim 1, further comprising: a touch sensor layer disposed on the encapsulation layer; and a color filter layer disposed on the touch sensor layer.

5. A display panel, comprising:

a circuit layer disposed on a substrate;

a light-emitting element layer disposed on the circuit layer; and an encapsulation layer configured to cover the light-emitting element layer, wherein:

the light-emitting element layer includes a bank pattern having an opening covering an edge of an electrode pattern;

the bank pattern includes a tapered part having a width from an end of the electrode pattern to the opening of the bank pattern; and at least one of the width and a slope angle of the tapered part within a subpixel is partially differently set, wherein the tapered part of the bank pattern includes an engraved pattern, and wherein the engraved pattern has an irregular pattern.

6. The display panel of claim 5, wherein the tapered part has a difference in the slope angle greater than 0° and less than or equal to 45° according to a presence or absence of the engraved pattern.

7. The display panel of claim 5, wherein at least one of the width and the slope angle of the tapered part in adjacent subpixels is differently set.

8. The display panel of claim 5, further comprising: a touch sensor layer disposed on the encapsulation layer; and a polarizing plate disposed on the touch sensor layer.

9. The display panel of claim 5, further comprising: a touch sensor layer disposed on the encapsulation layer; and a color filter layer disposed on the touch sensor layer.

10. A display panel, comprising:

a circuit layer disposed on a substrate;

a light-emitting element layer disposed on the circuit layer; and an encapsulation layer configured to cover the light-emitting element layer, wherein:

the light-emitting element layer includes a bank pattern having an opening covering an edge of an electrode pattern;

the bank pattern includes a tapered part having a width from an end of the electrode pattern to the opening of the bank pattern; and at least one of the width and a slope angle of the tapered part within a subpixel is partially differently set, wherein the tapered part of the bank pattern includes an engraved pattern, and wherein the engraved pattern makes the slope angle of the tapered part partially different.

11. The display panel of claim 10, wherein the tapered part has a difference in the slope angle greater than 0° and less than or equal to 45° according to a presence or absence of the engraved pattern.

12. The display panel of claim 10, further comprising: a touch sensor layer disposed on the encapsulation layer; and a polarizing plate disposed on the touch sensor layer.

13. The display panel of claim 10, further comprising: a touch sensor layer disposed on the encapsulation layer; and a color filter layer disposed on the touch sensor layer.

14. A display panel, comprising:

a circuit layer disposed on a substrate;

a light-emitting element layer disposed on the circuit layer; and an encapsulation layer configured to cover the light-emitting element layer, wherein:

the light-emitting element layer includes a bank pattern having an opening covering an edge of an electrode pattern;

the bank pattern includes a tapered part having a width from an end of the electrode pattern to the opening of the bank pattern; and at least one of the width and a slope angle of the tapered part within a subpixel is partially differently set, wherein the tapered part of the bank pattern includes an uneven pattern that makes the width of the tapered part partially different.

* * * * *